(12) United States Patent
Vinciarelli et al.

(10) Patent No.: US 12,096,549 B1
(45) Date of Patent: *Sep. 17, 2024

(54) PANEL MOLDED ELECTRONIC ASSEMBLIES WITH MULTI-SURFACE CONDUCTIVE CONTACTS

(71) Applicant: Vicor Corporation, Andover, MA (US)

(72) Inventors: Patrizio Vinciarelli, Boston, MA (US); Patrick R. Lavery, North Andover, MA (US); Rudolph F. Mutter, North Andover, MA (US); Jeffery J. Kirk, Scarborough, ME (US); Andrew T. D'Amico, Beverly Hills, CA (US)

(73) Assignee: Vicor Corporation, Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,734

(22) Filed: Jan. 24, 2022

Related U.S. Application Data

(60) Continuation of application No. 16/705,585, filed on Dec. 6, 2019, which is a division of application No.
(Continued)

(51) Int. Cl.
*H05K 1/02* (2006.01)
*H01L 23/053* (2006.01)
(Continued)

(52) U.S. Cl.
CPC .......... *H05K 1/0204* (2013.01); *H05K 1/111* (2013.01); *H05K 1/181* (2013.01); *H05K 1/186* (2013.01);
(Continued)

(58) Field of Classification Search
CPC ...... H05K 1/0204; H05K 1/111; H05K 1/181; H05K 1/186; H05K 3/0014; H05K 3/0026;
(Continued)

(56) References Cited

U.S. PATENT DOCUMENTS 3,409,805 A 11/1968 Whippl
4,211,603 A 7/1980 Reed
(Continued)

FOREIGN PATENT DOCUMENTS

JP H04 293293 10/1992
WO WO 1995/027308 10/1995
(Continued)

OTHER PUBLICATIONS

AFM Microelectronics Inc., "General Purpose Capacitors," www.afmmicroelectronics.com, 14 pages, published on or before Jul. 26, 2010.
(Continued)

*Primary Examiner* — Jeffrey T Carley
*Assistant Examiner* — Jose K Abraham
(74) *Attorney, Agent, or Firm* — Fish & Richardson P.C.

(57) ABSTRACT

Electronic modules having complex contact structures may be formed by encapsulating panels containing pluralities of electronic modules delineated by cut lines and having conductive interconnects buried within the panel along the cut lines. Holes defining contact regions along the electronic module sidewall may be cut into the panel along the cut lines to expose the buried interconnects. The panel may be metallized, e.g. by a series or processes including plating, on selected surfaces including in the holes to form the contacts and other metal structures followed by cutting the panel along the cut lines to singulate the individual electronic models. The contacts may be located in a conductive grove providing a castellated module.

32 Claims, 13 Drawing Sheets

Related U.S. Application Data

15/969,882, filed on May 3, 2018, now Pat. No. 10,537,015, which is a division of application No. 14/731,287, filed on Jun. 4, 2015, now Pat. No. 10,264,664.

(51) Int. Cl.
| | |
|---|---|
| *H01L 23/057* | (2006.01) |
| *H01L 23/28* | (2006.01) |
| *H05K 1/11* | (2006.01) |
| *H05K 1/18* | (2006.01) |
| *H05K 3/00* | (2006.01) |
| *H05K 3/16* | (2006.01) |
| *H05K 3/18* | (2006.01) |
| *H05K 3/20* | (2006.01) |
| *H05K 3/24* | (2006.01) |
| *H05K 3/38* | (2006.01) |
| *H01L 21/44* | (2006.01) |
| *H01L 23/14* | (2006.01) |

(52) U.S. Cl.
CPC ......... *H05K 3/0014* (2013.01); *H05K 3/0026* (2013.01); *H05K 3/0044* (2013.01); *H05K 3/0079* (2013.01); *H05K 3/16* (2013.01); *H05K 3/18* (2013.01); *H05K 3/207* (2013.01); *H05K 3/24* (2013.01); *H05K 3/381* (2013.01); *H01L 21/44* (2013.01); *H01L 23/053* (2013.01); *H01L 23/057* (2013.01); *H01L 23/147* (2013.01); *H01L 23/28* (2013.01); *H05K 2201/1003* (2013.01); *Y10T 29/49146* (2015.01)

(58) Field of Classification Search
CPC .... H05K 3/0044; H05K 3/0079; H05K 3/316; H05K 3/18; H05K 3/207; H05K 3/24; H05K 3/381; H05K 2001/1003; H01L 21/44; H01L 23/053; H01L 23/057; H01L 23/147; Y10T 29/49146
See application file for complete search history.

(56) References Cited

U.S. PATENT DOCUMENTS

| | | | |
|---|---|---|---|
| 4,326,765 A | 4/1982 | Brancaleone | |
| 4,366,342 A | 12/1982 | Breedlove | |
| 4,551,747 A | 11/1985 | Gilbert et al. | |
| 4,711,026 A | 12/1987 | Swiggett et al. | |
| 4,859,807 A | 8/1989 | Swiggett et al. | |
| 5,027,255 A | 6/1991 | Zeitlin | |
| 5,206,795 A | 4/1993 | Belanger, Jr. | |
| 5,241,133 A | 8/1993 | Mullen et al. | |
| 5,247,423 A | 9/1993 | Lin et al. | |
| 5,471,366 A | 11/1995 | Ozawa | |
| 5,481,436 A | 1/1996 | Werther | |
| 5,557,142 A | 9/1996 | Gilmore | |
| 5,728,600 A | 3/1998 | Vinciarelli et al. | |
| 5,776,796 A | 7/1998 | Distefano | |
| 5,864,092 A | 1/1999 | Gore et al. | |
| 5,952,909 A | 9/1999 | Umeno et al. | |
| 5,973,923 A | 10/1999 | Jitaru et al. | |
| 5,990,776 A | 11/1999 | Jitaru | |
| 6,001,671 A | 12/1999 | Fjelstad | |
| 6,028,354 A | 2/2000 | Hoffman | |
| 6,031,726 A | 2/2000 | Vinciarelli et al. | |
| 6,073,339 A | 6/2000 | Levin | |
| 6,147,876 A | 11/2000 | Yamaguchi | |
| 6,184,585 B1 | 2/2001 | Martinez et al. | |
| 6,229,216 B1 | 5/2001 | Ma et al. | |
| 6,262,600 B1 | 7/2001 | Haigh et al. | |
| 6,288,905 B1 | 9/2001 | Chung et al. | |
| 6,391,685 B1 | 5/2002 | Hikita et al. | |
| 6,403,009 B1 | 6/2002 | Saxelby, Jr. et al. | |
| 6,501,364 B1 | 12/2002 | Hui et al. | |
| 6,566,234 B1 | 5/2003 | Capote et al. | |
| 6,586,822 B1 | 7/2003 | Vu | |
| 6,717,820 B1 | 4/2004 | Loh | |
| 6,734,552 B2 | 5/2004 | Combs | |
| 6,765,469 B2 | 7/2004 | Sortor | |
| 6,830,959 B2 | 12/2004 | Estacio | |
| 6,838,754 B2 | 1/2005 | Kim | |
| 6,888,438 B2 | 5/2005 | Hui et al. | |
| 6,903,938 B2 | 6/2005 | Waffenschmidt | |
| 6,940,013 B2 | 9/2005 | Vinciarelli et al. | |
| 6,982,876 B1 | 1/2006 | Young | |
| 7,015,587 B1 | 3/2006 | Poddar | |
| 7,030,469 B2 | 4/2006 | Mahadevan et al. | |
| 7,049,682 B1 | 5/2006 | Mathews | |
| 7,190,057 B2 | 3/2007 | Seki | |
| 7,198,987 B1 | 4/2007 | Warren et al. | |
| 7,268,425 B2 | 9/2007 | Mallik | |
| 7,283,345 B2 | 10/2007 | Liu | |
| 7,294,007 B1 | 11/2007 | Lawlyes | |
| 7,298,038 B2 | 11/2007 | Filoteo et al. | |
| 7,361,844 B2 | 4/2008 | Vinciarelli et al. | |
| 7,420,262 B2 | 9/2008 | Bauer et al. | |
| 7,468,547 B2 | 12/2008 | Harvey | |
| 7,474,185 B2 | 1/2009 | Hooey et al. | |
| 7,494,843 B1 | 2/2009 | Lin et al. | |
| 7,554,181 B2 | 6/2009 | Satou et al. | |
| 7,646,610 B2 | 1/2010 | Watanabe | |
| 7,701,051 B2 | 4/2010 | Bayerer et al. | |
| 7,701,731 B2 | 4/2010 | Dhuyvetter et al. | |
| 7,741,943 B2 | 6/2010 | Fouquet et al. | |
| 7,745,259 B2 * | 6/2010 | Sasaki | H01L 24/95 257/781 |
| 7,767,494 B2 | 8/2010 | Sasaki et al. | |
| 7,768,371 B2 | 8/2010 | Hui et al. | |
| 7,772,036 B2 | 8/2010 | Bauer et al. | |
| 7,786,837 B2 | 8/2010 | Hebert | |
| 7,915,992 B2 | 3/2011 | de Rooij et al. | |
| 7,952,879 B1 * | 5/2011 | Vinciarelli | H05K 7/209 361/708 |
| 7,972,143 B2 | 7/2011 | Smejtek | |
| 7,989,928 B2 | 8/2011 | Liao et al. | |
| 7,994,888 B2 | 8/2011 | Ikriannikov | |
| 8,030,750 B2 * | 10/2011 | Kim | H01L 24/97 257/E23.141 |
| 8,138,584 B2 | 3/2012 | Wang | |
| 8,188,806 B2 | 5/2012 | Ho et al. | |
| 8,240,035 B2 | 8/2012 | Nishikawa | |
| 8,263,434 B2 | 9/2012 | Pagaila | |
| 8,299,882 B2 | 10/2012 | Ikriannikov | |
| 8,344,842 B1 | 1/2013 | Luzanov | |
| 8,354,740 B2 | 1/2013 | Liu et al. | |
| 8,385,043 B2 | 2/2013 | Ng et al. | |
| 8,427,269 B1 | 4/2013 | Vinciarelli et al. | |
| 8,461,672 B2 * | 6/2013 | Haba | H01L 24/24 438/109 |
| 8,488,324 B2 | 7/2013 | Becker et al. | |
| 8,513,789 B2 * | 8/2013 | Haba | H01L 21/30604 257/678 |
| 8,551,815 B2 * | 10/2013 | Avsian | H01L 21/50 438/109 |
| 8,592,944 B2 | 11/2013 | Santangelo et al. | |
| 8,629,543 B2 * | 1/2014 | McElrea | H01L 24/24 257/686 |
| 8,896,111 B2 | 11/2014 | Vinciarelli | |
| 8,963,676 B1 | 2/2015 | Hoang | |
| 8,966,747 B2 | 3/2015 | Vinciarelli et al. | |
| 9,105,613 B1 | 8/2015 | Chen et al. | |
| 9,107,290 B1 * | 8/2015 | Chen | H05K 3/0061 |
| 9,305,862 B2 * | 4/2016 | McElrea | H01L 24/80 |
| 9,324,672 B2 | 4/2016 | Pagaila | |
| 9,402,319 B2 | 7/2016 | Vinciarelli et al. | |
| 9,439,297 B2 | 9/2016 | Vinciarelli | |
| 9,516,761 B2 | 12/2016 | Vinciarelli et al. | |
| 9,819,263 B2 | 11/2017 | Zeng et al. | |
| 9,936,580 B1 | 4/2018 | Vinciarelli et al. | |
| 9,967,984 B1 | 5/2018 | Vinciarelli | |
| 10,264,664 B1 | 4/2019 | Vinciarelli et al. | |

(56) References Cited

U.S. PATENT DOCUMENTS

| | | | |
|---|---|---|---|
| 10,264,670 B2 | 4/2019 | Oh | |
| 10,506,712 B1 | 12/2019 | Tsao et al. | |
| 10,681,821 B2* | 6/2020 | Karpman | H05K 1/185 |
| 10,757,816 B2 | 8/2020 | Vinciarelli et al. | |
| 10,785,871 B1 | 9/2020 | Vinciarelli et al. | |
| 10,791,645 B1 | 9/2020 | Vinciarelli | |
| 10,877,534 B2 | 12/2020 | Zeng | |
| 10,903,734 B1 | 1/2021 | Vinciarelli | |
| 2001/0023980 A1 | 9/2001 | Ohmori | |
| 2001/0032388 A1 | 10/2001 | Morris | |
| 2002/0096348 A1 | 7/2002 | Saxelby et al. | |
| 2003/0011054 A1 | 1/2003 | Jenn et al. | |
| 2003/0058628 A1 | 3/2003 | Boylan | |
| 2003/0087538 A1 | 5/2003 | Ueno | |
| 2003/0095026 A1 | 5/2003 | Kawanobe | |
| 2004/0094834 A1 | 5/2004 | Jun et al. | |
| 2004/0100778 A1 | 5/2004 | Vinciarelli et al. | |
| 2004/0157410 A1 | 8/2004 | Yamaguchi | |
| 2004/0207089 A1 | 10/2004 | Masuda | |
| 2004/0251554 A1 | 12/2004 | Masuda | |
| 2004/0259330 A1 | 12/2004 | Fujii et al. | |
| 2005/0037618 A1 | 2/2005 | Lee et al. | |
| 2005/0156699 A1 | 7/2005 | Hui et al. | |
| 2005/0167814 A1 | 8/2005 | Beroz et al. | |
| 2005/0168960 A1* | 8/2005 | Asahi | H05K 3/403 |
| | | | 257/E21.705 |
| 2005/0184381 A1 | 8/2005 | Asahi | |
| 2005/0206014 A1 | 9/2005 | Sakamoto et al. | |
| 2006/0011383 A1 | 1/2006 | Noguchi | |
| 2006/0097831 A1 | 5/2006 | Lotfi et al. | |
| 2006/0127652 A1 | 6/2006 | Kanaya et al. | |
| 2006/0133041 A1 | 6/2006 | Belady | |
| 2006/0133042 A1 | 6/2006 | Belady | |
| 2006/0180346 A1 | 8/2006 | Knight et al. | |
| 2006/0216867 A1 | 9/2006 | Kawata et al. | |
| 2006/0272150 A1 | 12/2006 | Eguchi et al. | |
| 2006/0283547 A1 | 12/2006 | Yuri et al. | |
| 2006/0283625 A1 | 12/2006 | Yamamichi et al. | |
| 2007/0102142 A1* | 5/2007 | Reis | H05K 1/0204 |
| | | | 257/E23.105 |
| 2007/0107935 A1 | 5/2007 | Hash et al. | |
| 2007/0158799 A1 | 7/2007 | Chiu | |
| 2007/0215990 A1 | 9/2007 | San Antonio et al. | |
| 2007/0241440 A1 | 10/2007 | Hoang et al. | |
| 2008/0000680 A1* | 1/2008 | Cho | H05K 1/0206 |
| | | | 174/262 |
| 2008/0311771 A1 | 12/2008 | Cho | |
| 2009/0070996 A1* | 3/2009 | Sakamoto | H01L 23/13 |
| | | | 29/852 |
| 2009/0140394 A1 | 6/2009 | Bathan et al. | |
| 2009/0156913 A1 | 6/2009 | MacNeish, III | |
| 2009/0160065 A1* | 6/2009 | Haba | H01L 24/97 |
| | | | 438/109 |
| 2009/0175014 A1 | 7/2009 | Zeng et al. | |
| 2009/0236708 A1 | 9/2009 | Shi et al. | |
| 2009/0251873 A1 | 10/2009 | Chenq | |
| 2009/0321956 A1 | 12/2009 | Sasaki et al. | |
| 2009/0321957 A1 | 12/2009 | Sasaki et al. | |
| 2009/0325345 A1 | 12/2009 | Sasaki et al. | |
| 2010/0013085 A1 | 1/2010 | Park et al. | |
| 2010/0072604 A1 | 3/2010 | Komatsu et al. | |
| 2010/0149768 A1* | 6/2010 | Takaike | H05K 1/186 |
| | | | 29/830 |
| 2010/0170085 A1* | 7/2010 | Schaaf | H01L 23/5389 |
| | | | 29/832 |
| 2010/0197150 A1 | 8/2010 | Smejtek | |
| 2010/0246152 A1 | 9/2010 | Lin et al. | |
| 2010/0259909 A1 | 10/2010 | Ho et al. | |
| 2010/0290199 A1 | 11/2010 | Schmid et al. | |
| 2010/0328913 A1* | 12/2010 | Kugler | H05K 1/188 |
| | | | 29/841 |
| 2010/0330725 A1 | 12/2010 | Yoshizawa et al. | |
| 2011/0050292 A1 | 3/2011 | Hui et al. | |
| 2011/0088936 A1* | 4/2011 | Schaaf | H05K 1/188 |
| | | | 29/832 |
| 2011/0100691 A1 | 5/2011 | Yugawa | |
| 2011/0116236 A1 | 5/2011 | Akahori | |
| 2011/0128033 A1 | 6/2011 | Ohsawa | |
| 2011/0203839 A1 | 8/2011 | Iwamoto | |
| 2011/0314666 A1 | 12/2011 | Harazono et al. | |
| 2012/0073864 A1 | 3/2012 | Stefanoff | |
| 2012/0152600 A1 | 6/2012 | Nishioka et al. | |
| 2012/0170240 A1* | 7/2012 | Tanaka | H01L 24/32 |
| | | | 361/783 |
| 2012/0199958 A1* | 8/2012 | Horibe | H01L 21/561 |
| | | | 257/659 |
| 2012/0287582 A1* | 11/2012 | Vinciarelli | B29C 45/14639 |
| | | | 361/728 |
| 2013/0050226 A1 | 2/2013 | Shenoy et al. | |
| 2013/0081866 A1 | 4/2013 | Furutani et al. | |
| 2013/0153279 A1 | 6/2013 | Hayashi | |
| 2013/0164952 A1 | 6/2013 | Wu | |
| 2013/0170148 A1* | 7/2013 | Sun | H01L 21/6835 |
| | | | 361/728 |
| 2013/0223038 A1 | 8/2013 | Yamamoto | |
| 2014/0001616 A1 | 1/2014 | Daniels et al. | |
| 2014/0034373 A1 | 2/2014 | Yoshikawa et al. | |
| 2014/0102626 A1 | 4/2014 | Clayton | |
| 2014/0124906 A1 | 5/2014 | Park et al. | |
| 2014/0124907 A1 | 5/2014 | Park et al. | |
| 2014/0134799 A1 | 5/2014 | Daniels et al. | |
| 2014/0218155 A1 | 8/2014 | Akre | |
| 2014/0355218 A1 | 12/2014 | Vinciarelli et al. | |
| 2015/0116891 A1 | 4/2015 | Park et al. | |
| 2015/0173258 A1* | 6/2015 | Chen | H05K 9/0039 |
| | | | 361/753 |
| 2015/0181719 A1 | 6/2015 | Vinciarelli et al. | |
| 2015/0181727 A1 | 6/2015 | Vinciarelli | |
| 2016/0007460 A1 | 1/2016 | Shimizu et al. | |
| 2016/0014898 A1 | 1/2016 | Adachi et al. | |
| 2016/0021758 A1 | 1/2016 | Furutani et al. | |
| 2016/0021759 A1 | 1/2016 | Furutani et al. | |
| 2016/0042861 A1 | 2/2016 | Mano et al. | |
| 2016/0043027 A1 | 2/2016 | Inagaki et al. | |
| 2016/0044780 A1 | 2/2016 | Inagaki et al. | |
| 2016/0150646 A1 | 5/2016 | Oh | |
| 2016/0174376 A1 | 6/2016 | Oh | |
| 2016/0293535 A1 | 10/2016 | Fukasawa et al. | |
| 2016/0302312 A1 | 10/2016 | Vinciarelli et al. | |
| 2016/0365795 A1 | 12/2016 | Madsen | |
| 2016/0374194 A1 | 12/2016 | Miki | |
| 2017/0011982 A1 | 1/2017 | Theuss et al. | |
| 2017/0013748 A1 | 1/2017 | Saji et al. | |
| 2017/0048981 A1 | 2/2017 | Hu et al. | |
| 2017/0115144 A1 | 4/2017 | Watanabe et al. | |
| 2017/0372991 A1 | 12/2017 | Tsukamoto et al. | |
| 2018/0042124 A1 | 2/2018 | Makino et al. | |
| 2019/0059152 A1 | 2/2019 | Boozer et al. | |
| 2019/0116667 A1 | 4/2019 | Chen et al. | |
| 2020/0253060 A1 | 8/2020 | Vinciarelli et al. | |

FOREIGN PATENT DOCUMENTS

| | | |
|---|---|---|
| WO | WO 2004/017399 | 2/2004 |
| WO | WO 2012/155036 | 11/2012 |

OTHER PUBLICATIONS

Analog Devices, "ADM2490E: 5 kV Signal Isolated, High Speed (16 Mbps), ESD Protected, Full Duplex RS-485 Transceiver", 2 pages, downloaded Sep. 30, 2011.

Analog Devices, "High Speed, ESD-Protected, Full-Duplex, iCoupler Isolated RS-485 Transceiver", 16 pages, 2006-2008.

Analog Devices, "iCoupler® Digital Isolation—Unparalleled Performance and Integration", downloaded Aug. 31, 2011.

Application Notes, Connectors for LED Lighting Applications, Mill-Max Mfg. Corp., Jun. 20, 2014.

Avago Technologies, "ACML-7400, ACML-7410 and ACML-7420 3.3V/5V 100 MBd High Speed CMOS Digital Isolator", 13 pages, May 16, 2011.

(56) References Cited

OTHER PUBLICATIONS

Bhat et al., "Enhancement of Via Integrity in High-Tg Multilayer Printed Wiring Boards," IEEE Transactions on Components, Packaging and Manufacturing Technology, Feb. 19, 2013 3(5):888-894.
Braun et al. "Opportunities of Wafer Level Embedded Technologies for MEMS Devices"; SEMI MEMS Tech Seminar; (possibly published on Sep. 26, 2013); 22 pages.
Business Wire, "Analog Devices Introduces First Digital Isolator Packaging that Meets Safety Requirements in Medical and Industrial Applications", www.businesswire.com/news/home/20111005005026/en/anaglog-Devices-Introduc . . . , 3 pages, Oct. 12, 2011.
Cao et al., "Zero-Current-Switching Multilevel Modular Switched Capacitor DC-DC Converter" IEEE Transactions on Industry Applications, Sep. 2010, 46(6):2536-2544.
Edge Mount Q-Strip/Q-PAIRS Interconnects Application Overview, TecTalk, Samtec, Inc. Dec. 2012.
GradConn, "Planar board to board connectors," accessed online http://gradconn.com/right-angle/board-connectors.asp Jun. 20, 2014.
Hui et al., "Optimal Operation of Coreless PCB Transformer-Isolated Gate Drive Circuits with Wide Switching Frequency Range," IEEE Transactions on Power Electronics, May 1999, 14(3)506-514.
Hui et al., "Some Electromagnetic Aspects of Coreless PCB Transformers", IEEE Transactions on Power Electronics, Jul. 2000, 15(4):805-810.
Ideas for attaching / connecting / stacking one PCB onto another with no gap; http://electronics.stackexchange.com/questions/45733/ideas-for -attaching-connecting-stacking-one-PCB-onto-another-with-No. gap; accessed on Jun. 3, 2015; 5 pages.
International Search Report and Written Opinion, PCT/US2012/37495, dated May 6, 2013, 18 pages.
Isolator vs. Optocoupler Technology, SiliconLabs, downloaded Feb. 22, 2013, 21 pages, www.silabs.com/products/power/isolators.
Kahn, "Technical Information: Multilayer Ceramic Capacitors—Materials and Manufacture," Microelectronics Inc., 8 pages, published on or before Jul. 26, 2010.
Lee et al., "Multilayer Stacked Coreless Printed Spiral Winding Inductor With Wide Frequency Bandwidth", IEEE Energy Conversion Congress and Exposition, Sep. 2009, pp. 1002-1009.
Minteer, "Design of a New Transformer-Isolated Analog Acquisition System," IEEE Transactions on Power Delivery, Jul. 2009, 24(3):1054-1062.
Mohan et al., "Power Electronics-Converters, Applications and Design", 2nd Edition, John Wiley and Sons, 1995, pp. 708-709.
NVE Corporation, "Isolator Product Application", 3 pages downloaded Sep. 30, 2011.
NVE Corporation, IL600 Series, 21 pages, Sep. 2010.
One Piece Card Edge, Series 9159, AVX, Jun. 12, 2014.
PCT International Search Report and Written Opinion, PCT/US2012/37495, dated May 6, 2013, 18 pages.
Siliconlabs, "Discrete ISOvolt-EVB", 14 pages, Rev. 02 Sep. 2011.
Siliconlabs, "SI8410/20/21", 30 pages, Mar. 2011.
Siliconlabs, "Si84xxDigital Isolators", downloaded Sep. 30, 2011.
Tang et al., "Evaluation of The Shielding Effects on Printed-Circuit-Board Transformers Using Ferrite Plates and Copper Sheets", IEEE Transactions on Power Technology, Nov. 2002, 17(6):1080-1088.
Texas Instmments, "Application Report IS072x Digital Isolator Magnetic-Field Immunity", 6 pages Jan. 2006—Revised Feb. 2006.
USPTO Ex Parte Quayle Office Action in U.S. Appl. No. 14/635,467, dated Mar. 11, 2016, 5 pages.
USPTO Notice of Allowance in U.S. Appl. No. 13/105,696, dated Nov. 18, 2014, 6 pages.
USPTO Notice of Allowance in U.S. Appl. No. 14/116,642, dated Jun. 3, 2016.
USPTO Notice of Allowance in U.S. Appl. No. 14/635,420, dated Feb. 17, 2016, 6 pages.
USPTO Office Action in U.S. Appl. No. 13/105,696, dated Sep. 25, 2013, 8 pages.
USPTO Office Action in U.S. Appl. No. 14/116,642, dated Feb. 9, 2016, 15 pages.
USPTO Office Action in U.S. Appl. No. 14/63 5,420, dated Oct. 22, 2015, 6 pages.
U.S. Appl. No. 12/493,773, entitled "Encapsulation Method and Apparatus for Electronic Modules", Application and Preliminary Amendment filed Jun. 29, 2009, 63 pages.
USPTO Reply to Action in U.S. Appl. No. 13/105,696, dated Mar. 25, 2014, 10 pages.
USPTO Reply to Action in U.S. Appl. No. 14/116,642, dated May 9, 2016, 16 pages.
USPTO Reply to Action in U.S. Appl. No. 14/635,420, dated Nov. 13, 2015, 9 pages.
USPTO Reply to Ex Parte Quayle Action in U.S. Appl. No. 14/635,467, dated May 6, 2016, 5 pages.
USPTO Supplemental Notice of Allowance in U.S. Appl. No. 14/635,420, dated Apr. 27, 2016, 6 pages.
Office Action in U.S. Appl. No. 17/698,139, dated Mar. 7, 2024, 22 pages.

\* cited by examiner

PANEL MOLDED ELECTRONIC ASSEMBLIES WITH MULTI-SURFACE CONDUCTIVE CONTACTS

CROSS-REFERENCE TO RELATED APPLICATIONS

This application is a continuation application of U.S. patent application Ser. No. 16/705,585, filed Dec. 6, 2019, now U.S. Pat. No. 11,324,107, which is a divisional application of and claims priority to U.S. patent application Ser. No. 15/969,882, filed on May 3, 2018, now U.S. Pat. No. 10,537,015, which is a divisional application of U.S. patent application Ser. No. 14/731,287, filed on Jun. 4, 2015, now U.S. Pat. No. 10,264,664, the entire contents of which are herein incorporated by reference.

FIELD OF THE INVENTION

This invention relates to the field of encapsulating electronic assemblies and more particularly to forming edge connections and other conductive features on and through encapsulated electronic assemblies including encapsulated power converters.

BACKGROUND

Contemporary electronic power systems require power converters capable of deployment at the point of load. Competing considerations require increasing power density, decreasing mounting area on customer motherboard, and lower cost.

An encapsulated electronic module, such as an electronic power converter module for example, may comprise a printed circuit assembly over-molded with an encapsulant to form some or all of the package and exterior structure or surfaces of the module. Encapsulation in this manner may aid in conducting heat out of the over-molded components, i.e., components that are mounted on the printed circuit assembly and covered with encapsulant. In the case of an electronic power converter module, the printed circuit assembly may include one or more inductive components, such as inductors and transformers. Encapsulated electronic power converters capable of being surface mount soldered to a customer motherboard are described in Vinciarelli et al., Power Converter Package and Thermal Management, U.S. Pat. No. 7,361,844, issued Apr. 22, 2008, (the "SAC Package Patent") (assigned to VLT, Inc. of Sunnyvale, Calif., the entire disclosure of which is incorporated herein by reference). Encapsulated electronic modules having at least one surface of a magnetic core structure exposed and methods for manufacturing the same are described in Vinciarelli et al., Encapsulation Method and Apparatus for Electronic Modules, U.S. Pat. No. 8,427,269 issued Apr. 23, 2013, (the "Exposed Core Patent") (assigned to VI Chip Inc. of Andover, Mass., the entire disclosure of which is incorporated herein by reference).

Methods of over-molding both sides of a printed circuit board assembly while leaving opposing regions on both sides of the printed circuit board free of encapsulant are described in Saxelby, et al., Circuit Encapsulation Process, U.S. Pat. No. 5,728,600, issued Mar. 17, 1998 and Saxelby, et al., Circuit Encapsulation, U.S. Pat. No. 6,403,009, issued Jun. 11, 2002 (collectively the "Molding Patents") (both assigned to VLT, Inc. of Sunnyvale, Calif. and incorporated by reference in their entirety).

Leads for connecting the encapsulated power converter substrate to the customer motherboard are described in Vinciarelli et al., Surface Mounting A Power Converter, U.S. Pat. No. 6,940,013, issued Sep. 6, 2005 (the "J-Lead Patent") (assigned to VLT, Inc. of Sunnyvale, Calif., the entire disclosure of which is incorporated herein by reference).

Encapsulation of electronic assemblies as panels and forming electrical contacts, e.g. bar codes, along vertical edges of portions of the panels, e.g. during singulation into modules, for establishing electrical connections to the circuitry inside each module are described in Vinciarelli et al., Panel-Molded Electronic Assemblies, U.S. Pat. No. 8,966,747, issued on Mar. 3, 2015 (the "Bar Code Patent"); and in Vinciarelli et al., Panel-Molded Electronic Assemblies, U.S. patent application Ser. No. 14/116,642, filed on Nov. 8, 2013 (the "PM CIP"); and three-dimensional contacts for establishing robust solder connections to the bar codes is described in Vinciarelli et al., Electronic Assemblies Having Components With Edge Connectors, U.S. patent application Ser. No. 14/596,914, filed on Jan. 14, 2015 (the "3D Bar Code Application"); (collectively "the Panel Mold Disclosures") (all of which are assigned to VLT, Inc. of Sunnyvale, Calif., and are incorporated in their entirety herein by reference).

SUMMARY

In general, in one aspect, a method of electrically interconnecting circuit assemblies is provided. The method includes assembling an encapsulated panel including a substrate having electronic components mounted to the substrate and one or more conductive features enclosed within the panel and unexposed to an exterior surface of the panel, the panel including one or more electronic modules having boundaries defined by one or more predetermined cut lines, and the one or more conductive features having portions that are located along the cut lines. The method includes selectively forming holes in the panel at predetermined locations along the cut lines exposing within selected holes respective portions of the one or more conductive features; selectively forming one or more conductive metal layers on selected surfaces of the panel including within the selected holes, each selected hole having a respective portion of the one or more conductive metal layers within the selected holes being in electrical contact with the respective portions of the one or more conductive features; and cutting the panel through the holes and along the one or more cut lines singulating the one or more electronic modules, each electronic module having electrical contacts formed along a perimeter edge of the module.

Implementations of the method may include one or more of the following features. The method can include preparing one or more surfaces of the encapsulated panel. Preparing one or more surfaces can include lapping the panel before selectively forming the holes. Preparing one or more surfaces can include lapping the panel after selectively forming the holes. Preparing one or more surfaces can include cleaning the panel ultrasonically in an aqueous solution before selectively forming the one or more metal layers. Preparing one or more surfaces can include laser etching the panel before selectively forming the one or more metal layers. Selectively forming one or more conductive metal layers can further include: (a) applying a seed layer including conductive particles to the surfaces of the panel, and subsequently (b) plating a layer of metal onto the seed layer. Applying the seed layer can include sputter coating the encapsulated panel with conductive particles. The sputtering can include sputtering copper particles. The sputtering can further include sputtering chromium particles. The method can further include coating the encapsulated panel with colloidal graphite and curing the graphite before the plating. The method can further include patterning the metal before cutting the panel. The patterning can include masking and subsequently etching the metal layer. The patterning can further include using a laser to expose or remove portions of the mask. The method can further include applying one or more finishing layers on top of the metal layer. Applying the seed layer can include applying conductive epoxy. Applying the seed layer can further include applying the conductive epoxy in a predetermined pattern. The method can further include coating the encapsulated panel with colloidal graphite and curing the graphite before the plating. The method can further include applying one or more finishing layers on top of the metal layer. The method can further include configuring the holes to provide gaps between adjacent contacts, in which the holes establish a pattern in the conductive metal layers along the perimeter edge of the one or more electronic modules. The method can further include patterning the one or more metal layers to form conductive pads on a selected surface of the one or more electronic modules, the pads providing a surface mounting area for one or more components. Patterning the metal layer can further include establishing electrical connections between respective ones of the pads to respective ones of the electrical contacts. The method can further include selectively forming auxiliary holes in the panel at predetermined locations spaced away from the cut lines; and selectively forming one or more conductive metal layers within the auxiliary holes to form thermal conduits for conducting heat from respective interior portions of the one or more electronic modules to an exterior surface. The auxiliary holes can be cut to a controlled depth without exposing within the auxiliary holes any components in the one or more electronic modules. The auxiliary holes can be cut through the entire thickness of the panel without exposing within the auxiliary holes any components in the one or more electronic modules. The cutting the auxiliary holes can expose within selected ones of the auxiliary holes respective portions of one or more auxiliary conductive features. The method can further include selectively forming auxiliary holes in the panel at predetermined locations spaced away from the cut lines exposing within selected ones of the auxiliary holes respective portions of one or more auxiliary conductive features; selectively forming one or more conductive metal layers within the auxiliary holes to form electrical connections to the auxiliary conductive features; and patterning the one or more metal layers to form conductive pads on a selected surface of the one or more electronic modules and electrical connections between selected ones of the pads and the one or more auxiliary conductive features, the pads providing a surface mounting area for one or more components.

In general, in another aspect, an apparatus includes a first circuit assembly having a first modular package including a first circuit board disposed between a top encapsulant and a bottom encapsulant, the first modular package having a perimeter edge connecting a top surface of the top encapsulant and a bottom surface of the bottom encapsulant, the perimeter edge having at least a first electrical contact electrically coupled to one or more conductive features embedded in the first circuit board. The first electrical contact extends along the perimeter edge from the first circuit board toward the top surface of the top encapsulant or toward the bottom surface of the bottom encapsulant such that the first electrical contact occupies a portion of the top or bottom encapsulant along the perimeter edge.

Implementations of the apparatus may include one or more of the following features. The first electrical contact can extend to the top surface of the top encapsulant or to the bottom surface of the bottom encapsulant. The first electrical contact can further include a side contact surface generally parallel to the perimeter edge, and a first contact surface generally parallel to the top surface of the top encapsulant or a second contact surface generally parallel to the bottom surface of the bottom encapsulant. The apparatus can include a second circuit board having a top surface that has a conductive pad, in which the first electrical contact includes the second contact surface, the conductive pad of the second circuit board is electrically coupled to the second contact surface of the first electrical contact of the first circuit assembly, the top surface of the second circuit board faces the bottom surface of the first modular package and is generally parallel to the bottom surface of the first modular package, and the perimeter edge of the first modular package is generally perpendicular relative to the top surface of the circuit board. The first electrical contact can include the first contact surface, and the first circuit assembly can further include an inductive component and the first contact surface can cover a surface of the inductive component. The first contact surface can extend over 50% of the top surface of the top encapsulant. The second contact surface can extend over 50% of the bottom surface of the bottom encapsulant. The first electrical contact can extend to both the top surface of the top encapsulant and the bottom surface of the bottom encapsulant. The first circuit board can include a multilayer circuit board, and the first electrical contact of the first circuit assembly can be electrically coupled to conductive features in multiple layers of the multilayer circuit board. The first circuit assembly can further include a second electrical contact that extends along the perimeter edge from the first circuit board toward the top surface of the top encapsulant or toward the bottom surface of the bottom encapsulant such that the second electrical contact occupies a portion of the top or bottom encapsulant along the perimeter edge, the second electrical contact can be electrically coupled to one or more conductive features embedded in the first circuit board, in which the first electrical contact can include an input contact configured to receive an input signal for the first circuit assembly, and the second electrical contact can include an output contact configured to provide an output signal from the first circuit assembly. The apparatus can further include a second circuit assembly having a second modular package including a second circuit board disposed between a top encapsulant and a bottom encapsulant, the second modular package can have a perimeter edge connecting a top surface of the top encapsulant and a bottom surface of the bottom encapsulant, the perimeter edge can have at least a second electrical contact electrically coupled to one or more conductive features embedded in the second circuit board, wherein the second electrical contact of the second modular package can extend to the top surface of the top encapsulant of the second modular package and can include a first contact surface generally parallel to the top surface of the top encapsulant, wherein the first electrical contact of the first modular package can extend to the bottom surface of the bottom encapsulant of the first modular package and can include a second contact surface generally parallel to the bottom surface of the bottom encapsulant, wherein the first contact surface of the second electrical contact can be electrically coupled to the second contact surface of the first electrical contact, the top surface of the second modular package can face the bottom surface of the first modular package and be generally parallel to the bottom surface of the first modular package, and the perimeter edge of the second modular package can be generally parallel to the perimeter edge of the first modular package. In some examples, the top surface of the second modular package can have a length and a width that are larger than corresponding length and width of the bottom surface of the first modular package. In some examples, the top surface of the second modular package can have a length and a width that are the same as corresponding length and width of the bottom surface of the first modular package. The first electrical contact can further include a side contact surface generally parallel to the perimeter edge, and the side contact surface can be recessed from the perimeter edge.

The details of one or more embodiments of the invention are set forth in the accompanying drawings and description below. Other features, objects, and advantages of the invention will be apparent from the description and drawings, and from the claims.

BRIEF DESCRIPTION OF DRAWINGS

Like references symbols in the various drawings indicate like elements.

DETAILED DESCRIPTION

I. Leadless Panel-Molded Module

Figure 1:
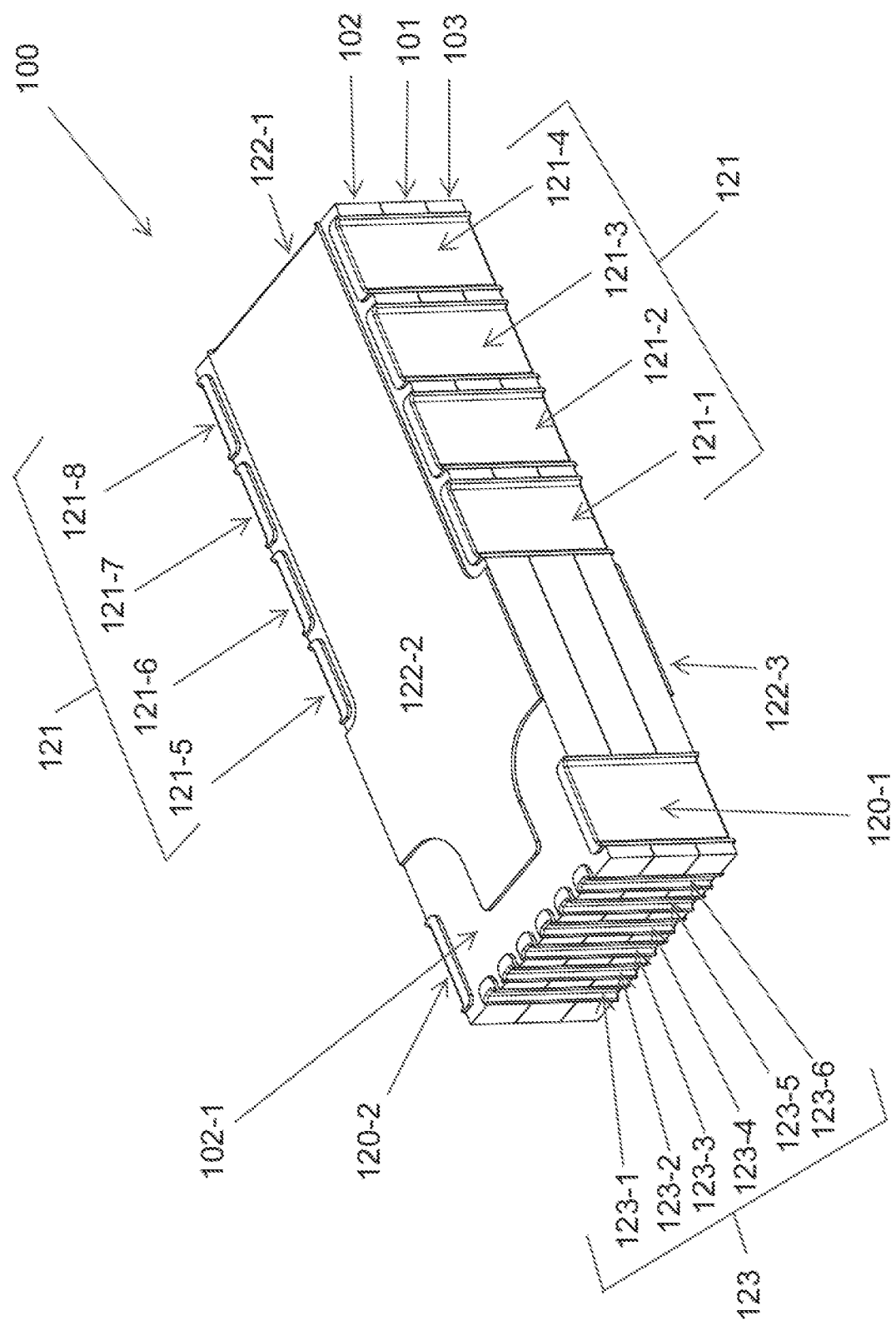
FIG. 1 shows an isometric view of a leadless panel-molded power converter module having castellated electrical-connections and integral heat-spreading EMI-shields.

Referring to FIG. 1, a leadless electronic module 100 is shown having a plurality of electrical contacts, e.g. 120-1, 120-2, 121, 122-1, and 123, situated in grooves located along all four perimeter edges of the module. As shown, the electrical contacts extend onto the top and bottom surfaces of the module 100. As shown in FIG. 1, wider electrical contacts (occupying greater perimeter length along the sidewalls), e.g. contacts 120-1, 120-2, 121, and 122-1 provide greater interconnect surface area and thus provide higher current carrying capacity, making them amenable for use as power connections. In the example shown, contacts 120-1 and 120-2 may be used for input power connections, 121-1 through 121-8 may be used for output power connections, and contact 122-1 may be used for a common connection for the output (or in a non-isolated example, for the input and output). As shown, the common connection extends laterally along a substantial portion of one side of the module 100 forming contact 122-1 and also extends over much (e.g., 50% or more) of the top and bottom surfaces of the module forming shields 122-2 and 122-3 either or both of which may also be used to establish electrical connections thus increasing the surface are and current carrying capacity. A plurality of narrower connections (occupying less perimeter length along the sidewalls) 123-1, 123-2, 123-3, 123-4, 123-5, 123-6, having less interconnect area and lower current carrying capacity, may be provided for signal connections, such as control and communication signals.

As shown in FIG. 1, the electronic module 100 includes a printed circuit board 101 (which can be, e.g., a multilayer printed circuit board) disposed between cured layers of encapsulant 102 and 103. The contacts 120-1, 120-2, 121, 122-1, and 123 extend vertically from the top surface of the cured encapsulant 102 to the bottom surface of the cured encapsulant 103. Because the encapsulant layers 102 and 103 cover the components mounted on the printed circuit board 101, the top surface of the encapsulant 102 and the bottom surface of the encapsulant 103 may provide smooth surfaces allowing multiple modules 100 (either of the same size or different sizes) to be stacked together (see FIGS. 12 and 13).

Figure 10:
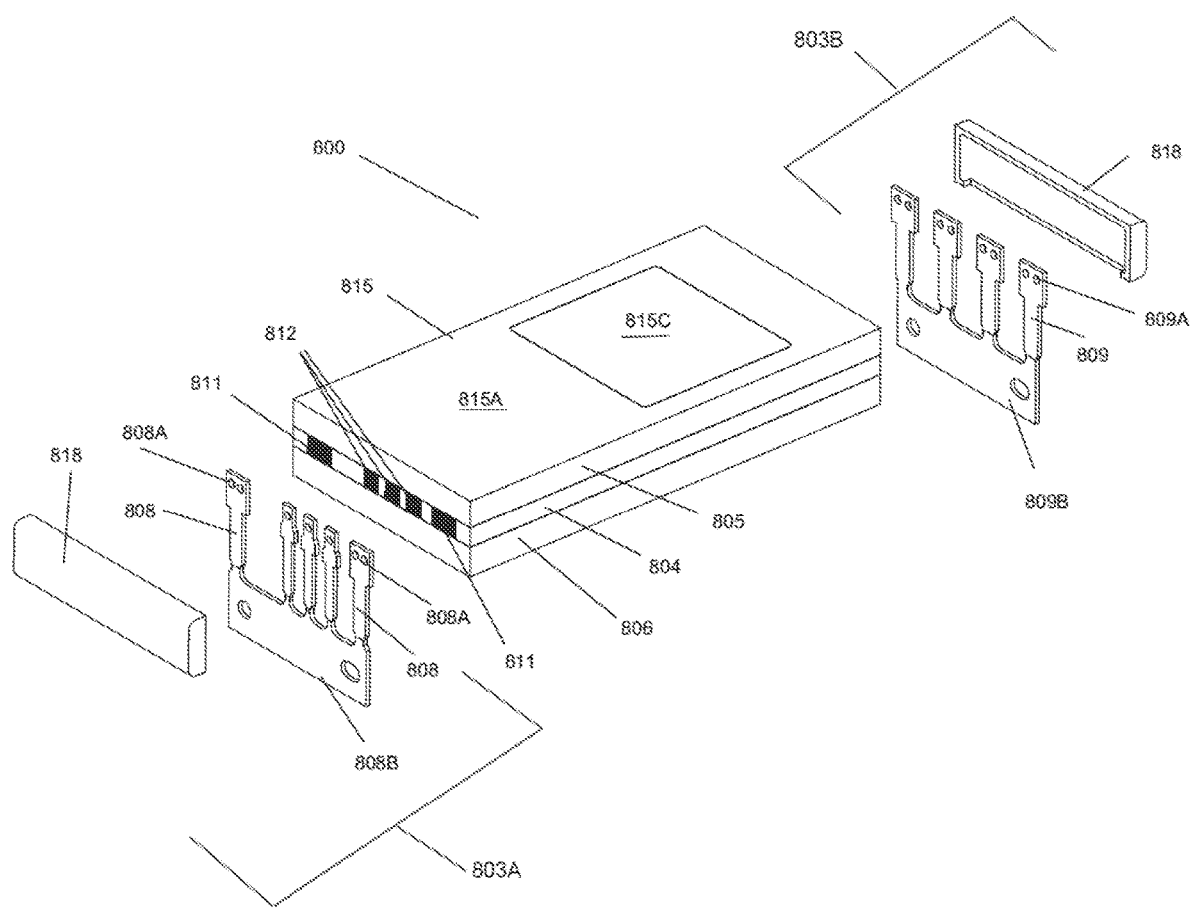
FIG. 10 (reproduced from FIG. 35 of the PM CIP) shows a heat-sinkless power converter made using the Center Plate Molding or Direct Molding techniques described in the PM CIP.

FIG. 10 (reproduced from FIG. 35 of the PM CIP) shows for comparison a heat-sinkless power converter 800 (PM CIP: ¶¶0137-0138) made using the Center Plate Molding or Direct Molding techniques described in the PM CIP (¶¶0139-0145 and 0146-0150 respectively). The horizontal-mount component 800 as shown includes a singulated module 815 and two adapters 803A, 803B, suitable for through-hole mounting to a motherboard. Other adapters are described in the PM CIP. As described in the Bar Code Patent and the PM Disclosures, the Center Plate and Direct Molding Techniques produce singulated modules, e.g. 815 (FIG. 10) that include a circuit board (which may be a multilayer printed circuit board) disposed between cured layers of encapsulant, e.g. encapsulant layers 805 and 806 (FIG. 10). The singulated module 815 also includes exposed interconnects ("bar codes"), e.g. bar codes 811 and 812 as shown in FIG. 10, and described in greater detail in the PM CIP (¶¶0100-0104) and the Bar Code Patent (Col. 15, ln 40-col. 17, ln 2). The top 815A and bottom 815B surfaces of the singulated module 815 may be defined by the cured encapsulant 805, 806 in which the magnetic core surfaces 815C, 815D are exposed.

Figure 2:
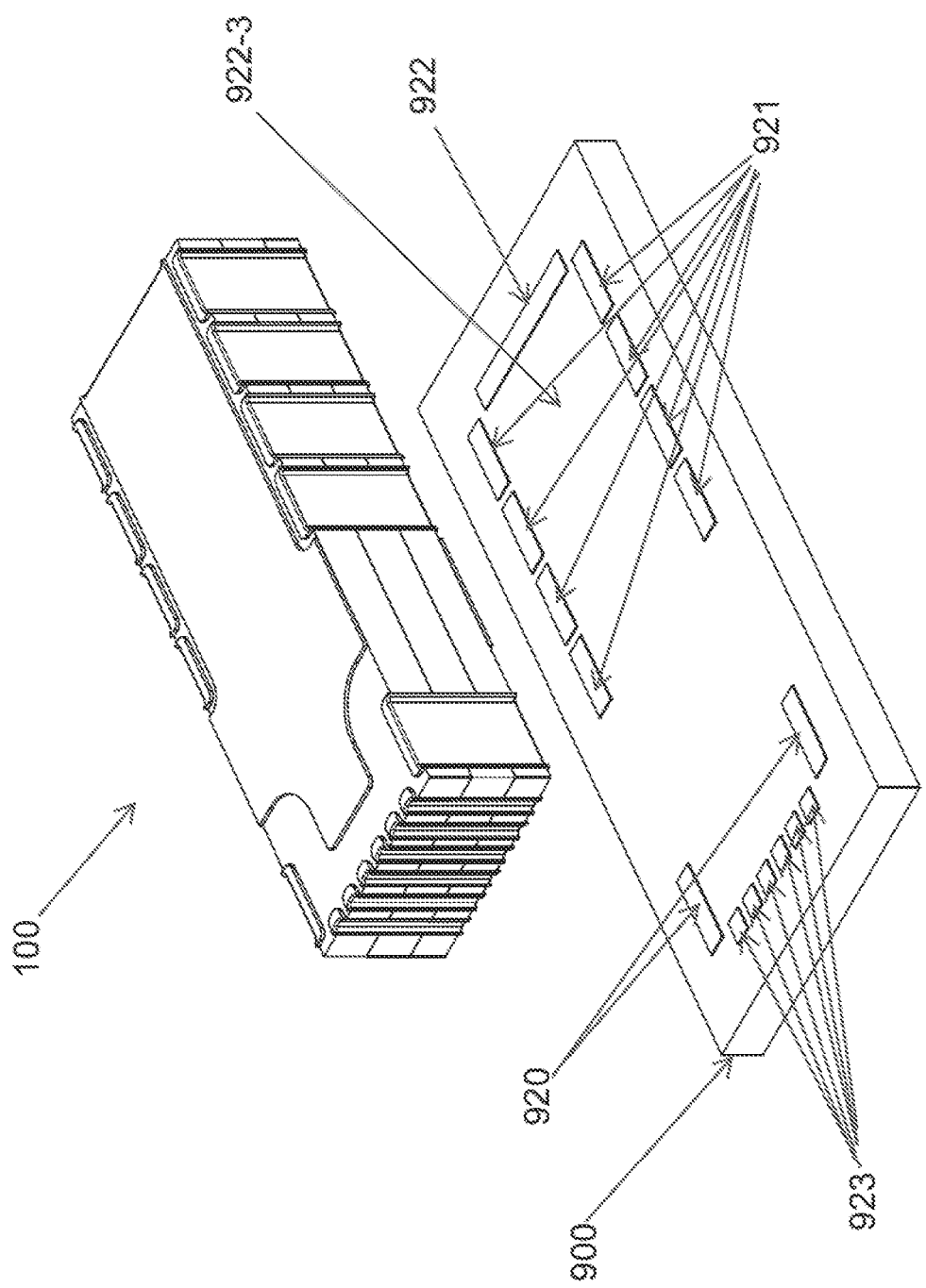
FIG. 2 shows an exploded isometric view of the leadless panel-molded power converter module of FIG. 1 with a printed circuit board.
Figure 3:
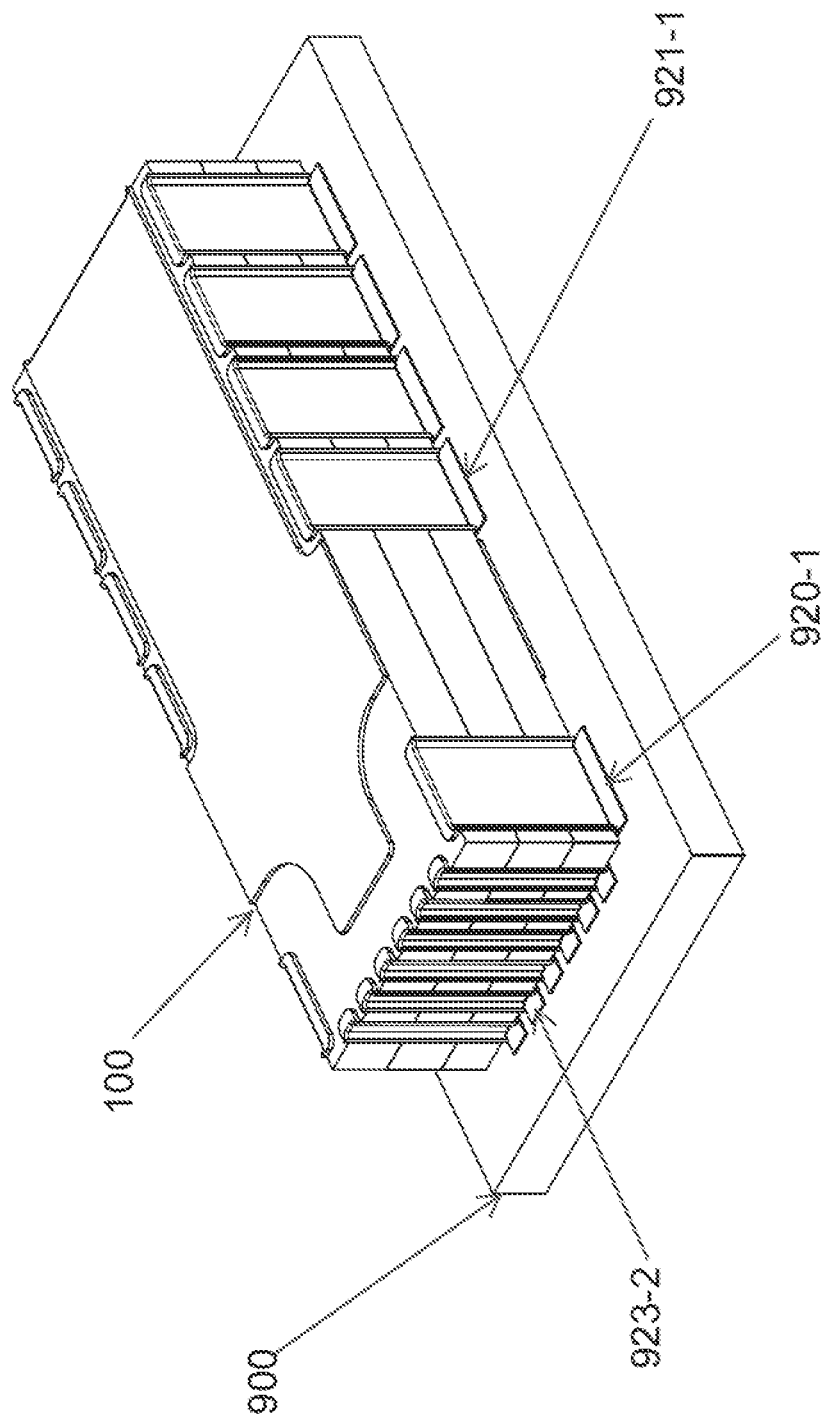
FIG. 3 shows an isometric view of the leadless panel-molded power converter module of FIG. 1 mounted to the printed circuit board.

Leadless modules such as leadless module 100 shown in FIGS. 1-3 may be more amenable to reductions in size and cost compared to the lead-frame modules, e.g. heat-sinkless module 800 in FIG. 10, described in the Panel Mold Disclosures. In addition, the leadless process described below allows as many surfaces of the singulated modules as desired to be used for forming electrical connections. In the example of FIG. 1, the electrical connections extend from the bar codes up and down the sidewalls and onto selected portions of the top and top and bottom surfaces of the module. As shown, all four sidewalls and the top and bottom surfaces of module 100 have metallized contacts.

Referring to FIGS. 2 and 3, the module 100 of FIG. 1 is shown in relation to a customer printed circuit board 900 having conductive pads 920, 921, 922, and 923 arranged to mate with corresponding contacts 120, 121, 122, and 123 on the module 100. Although conductive pad 922 is shown in FIG. 2 as mating with only a small portion of the common contacts 122-3 on the bottom surface of the module 100, it will be appreciated that contact 922 may be enlarged to extend below module 100 to provide greater contact area with the contact 122-3 on the bottom of the module. The castellated module 100 may be surface mount soldered to PCB 900. As shown in FIGS. 1-3, all four perimeter edges and selected portions of the bottom surface of the module 100 may be used to establish electrical connections between the module and an external PCB 900. While the top surface may also be used for electrical connections, the added complexity of establishing such top-surface connections may in many applications outweigh the incremental benefits.

Additionally portions of the top and bottom surfaces of the module 100, optionally including areas covering the magnetic cores (e.g., similar to 815C in FIG. 10), may be coated with electrically (and thermally) conductive material such as copper to provide electromagnetic shielding (e.g. for EMI reduction), improve heat distribution over the large surfaces of the module (e.g. provide isothermal planes), improved thermal coupling to the module (e.g. by conducting heat through a mounting board or substrate), and solder-mount options (e.g. shields/contacts 122-2 and 122-3 in FIG. 1). Additionally, the plated conductive layer may slow moisture absorption by the encapsulant (e.g., 102, 103), protect the magnetic cores, and help control leakage inductance in internal transformers.

II. Leadless Panel Mold Process

The preferred processes for making the leadless modules build upon the panel molding processes described in the Panel Mold Disclosures and will be described starting with an encapsulated PCB panel, such as panel 150 shown in FIG. 4. (See also, encapsulated panel 890 shown in FIGS. 43-44 of the PM CIP Application). The Panel Mold Disclosures describe making pluralities of electronic modules in panels having interconnection features buried within a substrate or PCB within the encapsulated panel, preferably along the boundaries of the individual circuits, so that electrical contacts are at least in part formed by or exposed by cutting the panel along the boundaries. (See e.g., cut lines 129 in FIG. 9A of the Bar Code Patent; and the description of buried interconnects and bar codes in the PM CIP at ¶¶0100-0104, and in the Bar Code Patent at col. 15, ln 40-col. 17, ln 2.)

The preferred method of making the encapsulated PCB panel for use in the leadless panel mold process described herein is called direct molding as described in the PM CIP Application (PM CIP: ¶¶0139-0149). Direct molding may include preparing one or more surfaces of the encapsulated panel. For example, as described below, the optional lapping finishing described in the PM CIP (PM CIP: ¶0150) may be used before (or after) the first step (cutting slots and holes) in the leadless panel mold process. Lapping before cutting the slots and holes may be preferred for establishing rounded edges between the top and bottom surfaces and the sidewall contacts, e.g. improving adhesion of the metal layers on the edges.

Figure 4:
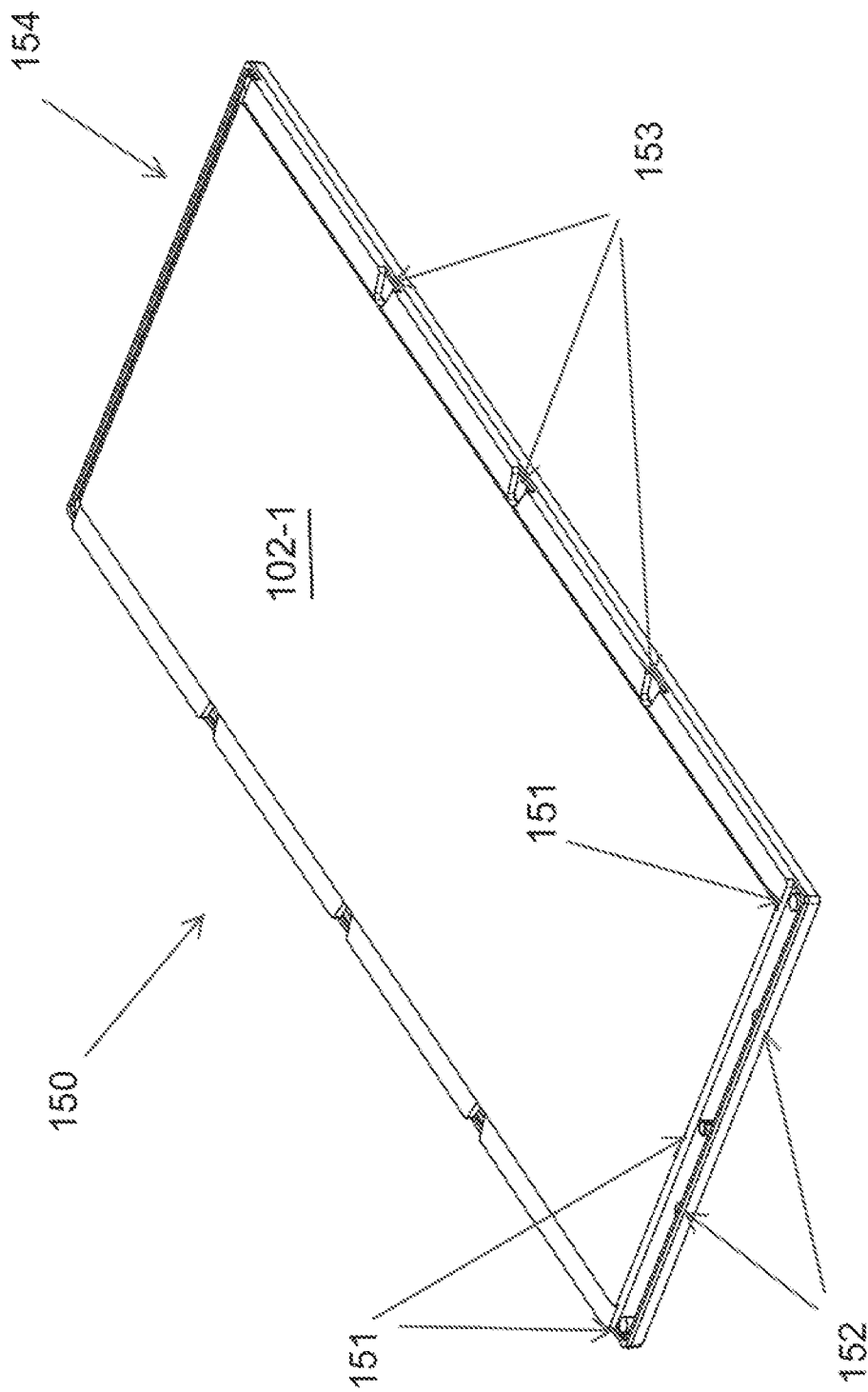
FIG. 4 shows an encapsulated panel assembly comprising a plurality of power converters prior to singulation.

Referring to FIG. 4, positional accuracy during the below-described process may be achieved by providing one or more holes, e.g. holes 151, in the substrate for generally registering the substrate with the mold during encapsulation and providing one or more fiducials, e.g. fiducials 152, on the substrate for precise registration during subsequent processing steps, such as the slot and hole cutting, patterning, and singulation steps. The fiducials 152 may be protected during encapsulation, e.g. using mold ejector pins or other features in the mold, to prevent the fiducials from being obscured by molding compound. Additional panel identifying information may be placed on the substrate in regions, e.g. region 154 or 153, where portions of the mold engage with, and prevent encapsulant from covering, the substrate. Additional examples of fiducials 891D for positioning and other panel identifying information are shown in FIG. 43 of the PM CIP. FIG. 42 of the PM CIP shows a cross-sectional view of the encapsulated panel assembly through one of the holes 871 in the encapsulant (which may be preferably formed by the presence of an ejector pin or other mold feature during encapsulation) exposing the fiducial mark 872 on the PCB panel.

Figure 5:
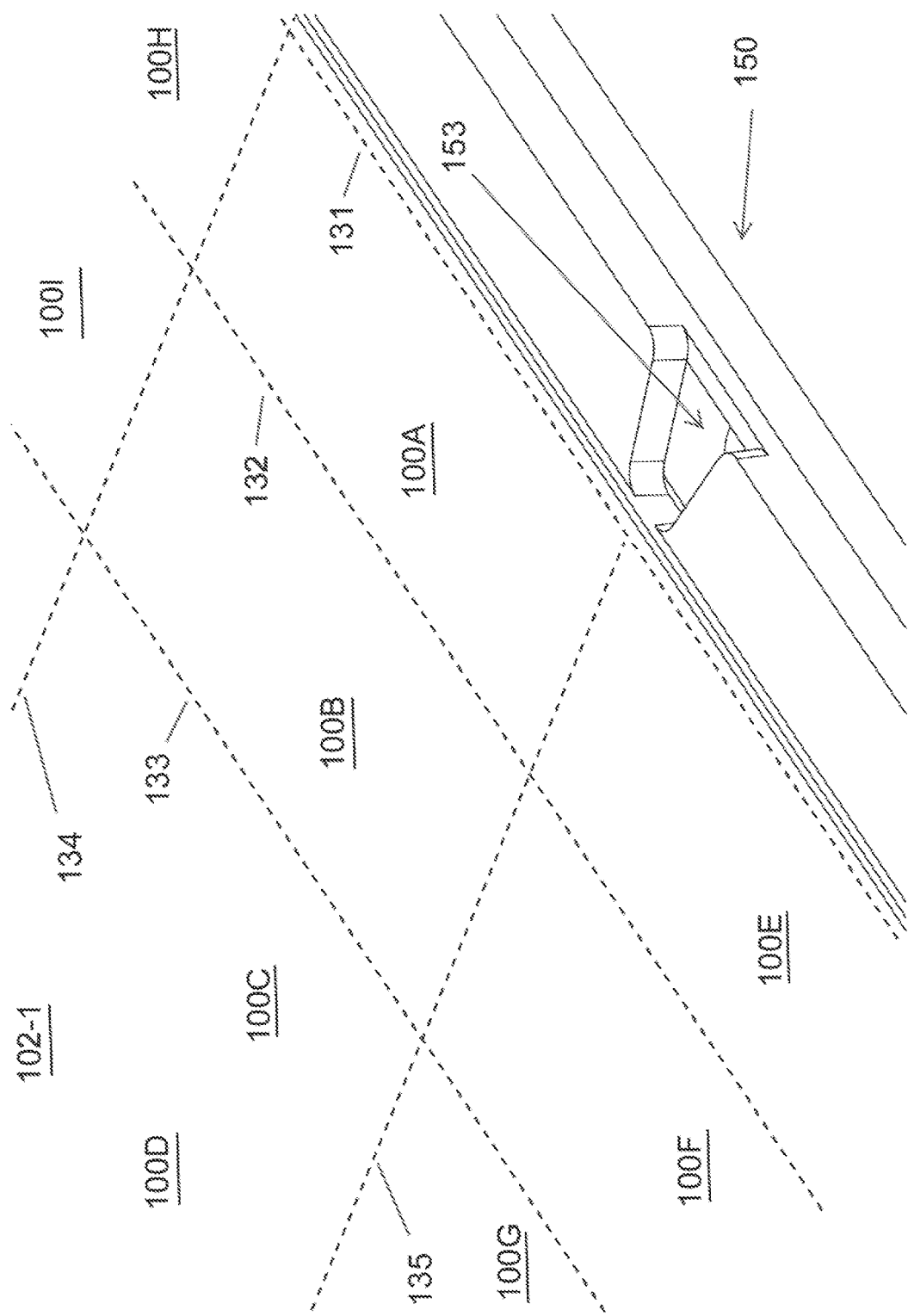
FIG. 5 is an exploded view showing details of the encapsulated panel assembly of FIG. 4.

Referring to FIG. 5, which is a close-up view of a portion of the encapsulated panel 150, several cut lines 131, 132, 133, 134, 135 are shown forming boundaries between a plurality of un-singulated modules, 100A, 100B, 100C, 100D, 100E, 100F, 100G, 100H, 100I. The modules 100A-100I remain integral parts of the encapsulated panel throughout the process until separated from the panel by singulation cuts as described in more detail below. In order to preserve legibility, the top surface 102-1 of the panel is shown in FIG. 5 without the details of any exposed magnetic cores, e.g. core 815C shown in FIG. 10, however it should be understood that magnetic cores may be exposed at the top and bottom surfaces of the un-singulated modules. As shown in FIG. 5, one of the features 153 where the mold may have supported the PCB during encapsulation is retained for reference continuity in FIGS. 5-8.

In a first example which will be described in connections with FIGS. 5-9, the process for making the castellated leadless modules (starting with an encapsulated and preferably lapped panel), may include: (a) forming slots or holes in or through the encapsulated panel, preferably perpendicular to one of the large planar surfaces, which produce the grooved contours in the sidewalls of the castellated modules, and in the process, exposes the buried interconnects, i.e. the bar codes, in the slots; (b) depositing a conductive seed layer; (c) plating a thicker conductive metal layer over the seed layer; (d) patterning the conductive layers; (e) applying one or more metallic finish layers; and (f) singulation, i.e. cutting the panel along the cut lines to form one or more individual modules. The above steps are described in greater detail below including optional steps. Additional options may include ultrasonic cleaning before application of the seed layer, or cutting the slots and holes before lapping and then ultrasonically cleaning the panel before applying the seed layer.

A. Castellation

Figure 6:
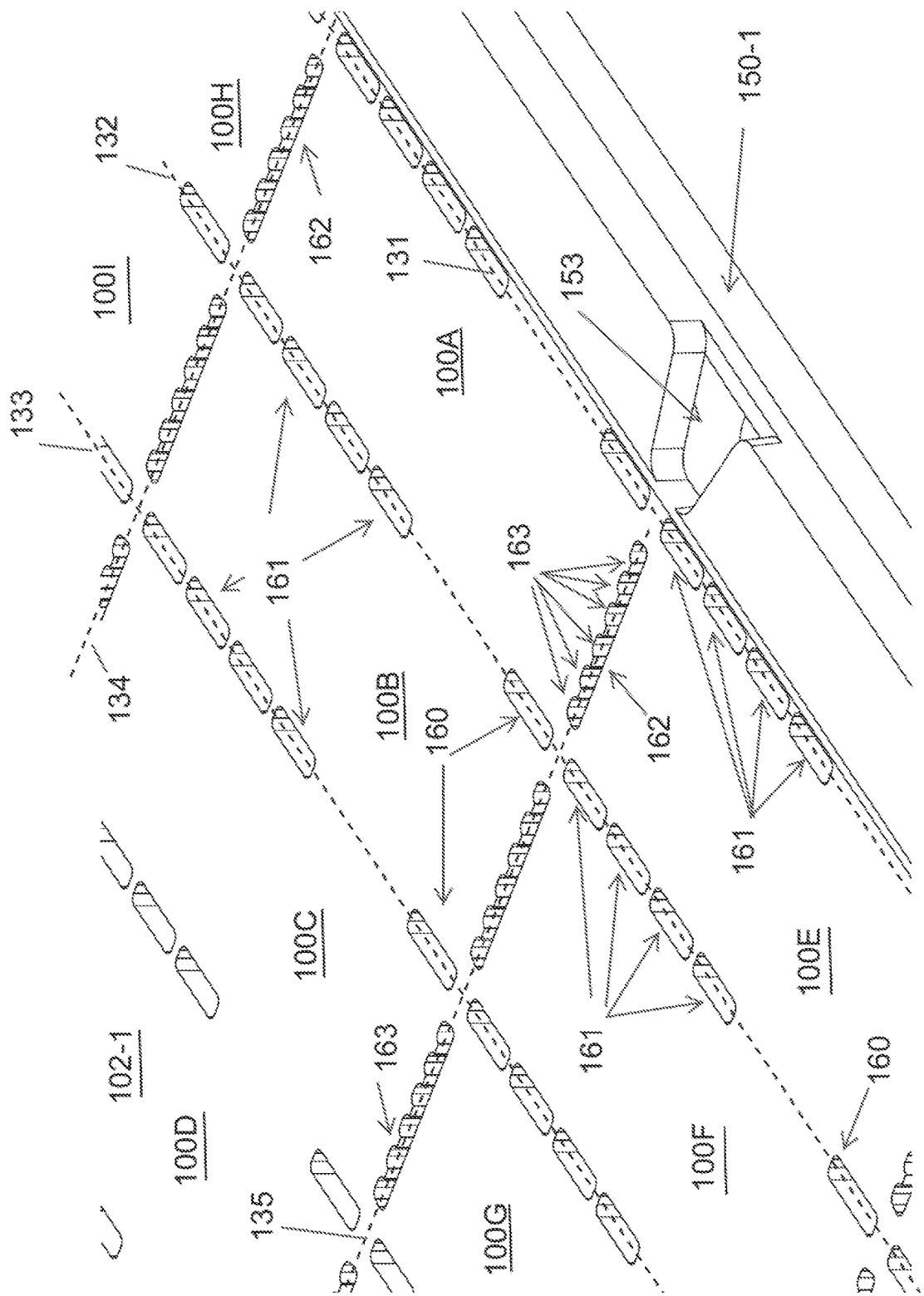
FIG. 6 is an exploded view showing details of the encapsulated panel assembly of FIG. 4 after slots are cut.

Referring to FIG. 6, an encapsulated and slotted panel 150-1 has slots, e.g. slotted openings 160, 161, 162, 163 formed along the cut lines, e.g. cut lines 131, 132, 133, 134, 135, which separate the un-singulated modules, 100A-100I. The slots or holes 160-163 preferably extend completely through the panel and are cut to produce the desired contours (castellations) in the singulated module. The slots or holes, e.g. 160, 161, 162, 163, may preferably be cut vertically down, from a surface, e.g. top surface 102-1 or bottom surface 103-1 (not shown) of the encapsulated panel 150 along the cut-lines in the areas where the contacts will be formed preferably before the panel is singulated to facilitate bulk processing of common sized panels compared with individual modules of varying sizes and shapes. The castellation process of forming slots or holes exposes buried contacts to form electrical connections, i.e. the buried interconnect features situated along the cut-lines which are exposed when the slots or holes are cut into the panel, i.e. along the cut lines as described in the Bar Code Patent (See FIG. 11, Col. 15, ln 61-col. 17, ln 2). However, the present castellation process differs in that the buried interconnects or bar codes are exposed within the slot or hole (during the slot or hole cutting step), which is preferably before the encapsulated panel is actually singulated.

The slots and holes may be formed using a high pressure water jet to cut away the encapsulant and substrate layers. Alignment of the water jet to the panel may be achieved using the exposed PCB fiducials or tooling holes or both. Abrasives in the water may be used to facilitate cutting quality, accuracy, and speed. The cutting of slots and holes may be optimized from either the top 102-1 or bottom 103-1 sides of the panel. Preferably, the holes and slots are cut to have the desired castellation contours and extending completely through the panel which may facilitate cleaning, plating, and finishing in subsequent steps. Although the slots and holes may be cut using a water jet, the speed and accuracy of the process may be improved by first establishing a pilot hole, e.g. a 0.010" diameter pilot hole using a laser. To avoid potential reflection of the laser by the buried interconnects, clearance holes may be provided in the buried interconnects in the region of the pilot hole, e.g. a 0.020-0.025" diameter clearance. As described earlier, formation of the slots in the encapsulated panel 150 exposes the buried interconnects in the sidewall of the slots which are metalized in subsequent steps to form electrical contacts.

Starting at the pilot hole, slots having the desired length (length along the cut lines), width (thickness of the slot perpendicular to the cut line), and contours may be cut using the water jet to establish the desired castellation grooves in the modules. For example, slots 160 along cut lines 131, 132, and 133 are relatively long (along the cut lines) to produce contacts 120-1, 120-2 (FIGS. 1, 9) in adjacent modules 100A, 100B, 100E, 100F, following singulation. Similarly, slots 161 along cut lines 131, 132, and 133 which also are relatively long (along the cut lines) to produce contacts 121 (FIGS. 1, 9) in adjacent modules 100A, 100B, 100E, 100F following singulation. In contrast, the slots along cut lines 134 and 135 are asymmetrical, having a smooth contour 162 recessed from the cut line on one side to produce the single very large contact 122-1 (FIG. 1, 9) in modules 100A, 100B, 100E, 100F, 100G; and having a saw tooth type contour on the other side. The saw tooth contour includes short (along the cut line) openings 163 which increase the width of the slot at the opening separated by short (along the cut line) teeth protruding toward the cut line. The openings 163 produce the small signal contacts 123 (FIGS. 1, 9) in modules 100A, 100B, 100C, 100H, 100I following singulation with the teeth forming the insulated areas between the contacts 123.

B. Seed Layer

To facilitate metalizing the slotted panel 150-1 (FIG. 6), a conductive seed layer may be deposited on the surfaces of the slotted panel including in the slots and holes. One way of applying the conductive coating includes sputter coating a thin layer of chromium, e.g. 600 Angstroms, followed by a thin layer of copper, e.g. 2 microns. The chromium seed layer may help adhering the sputter copper layer to the panel. Applying thicker seed layers by sputtering may not be practical with currently available technology. Preferably, the panel should be cleaned following the slot cutting (and lapping if performed), before the seed layers are applied to improve adhesion to the panel. For example, an ultrasonic water bath may be used to remove any particles which may interfere with adhesion from the panel surfaces. Additional or alternative cleaning or adhesion promoting processes may include de-ionized water pressure washing, plasma etching, and specialized baking cycles, e.g. including vacuum (<200 milli-Torr) baking or ultraviolet assisted baking.

Optionally, a graphite or carbon layer may be deposited either selectively in the slots and holes or over the entire panel for enhancing subsequent plating on the edges, i.e. the sidewalls of the slots and holes, between the buried interconnects (bar codes), which have been exposed within the slots and holes, and the metal on the top and bottom surfaces of the panel. For example, the panel may be dipped in a colloidal graphite solution (available from Electrochemicals Inc., Maple Plain, Minn. under the Shadow Graphite tradename; MacDermid, Inc., Waterbury, Conn. under the Blackhole tradename) which may then be cured prior to plating.

C. Plating

Using the seed layer, a thicker metal layer may be electrolessly or electrolytically plated onto the panel. However, a sputtered seed layer may be too porous to protect ferrite cores which may be exposed on the top and bottom surfaces of the panel (e.g. exposed ferrite core 815C in FIG. 10) and other potentially sensitive portions of the panel from acid solutions during the primary plating and subsequent etching processes. Sputtering a non-porous copper seed layer would take inordinately long using currently available technology. Therefore, a protective layer of copper, e.g. 5 microns thick, preferably may be electrolessly or electrolytically plated onto the seed layer using an alkaline solution. The ferrite cores are not as sensitive to the alkaline solution compared with an acid solution.

Figure 7:
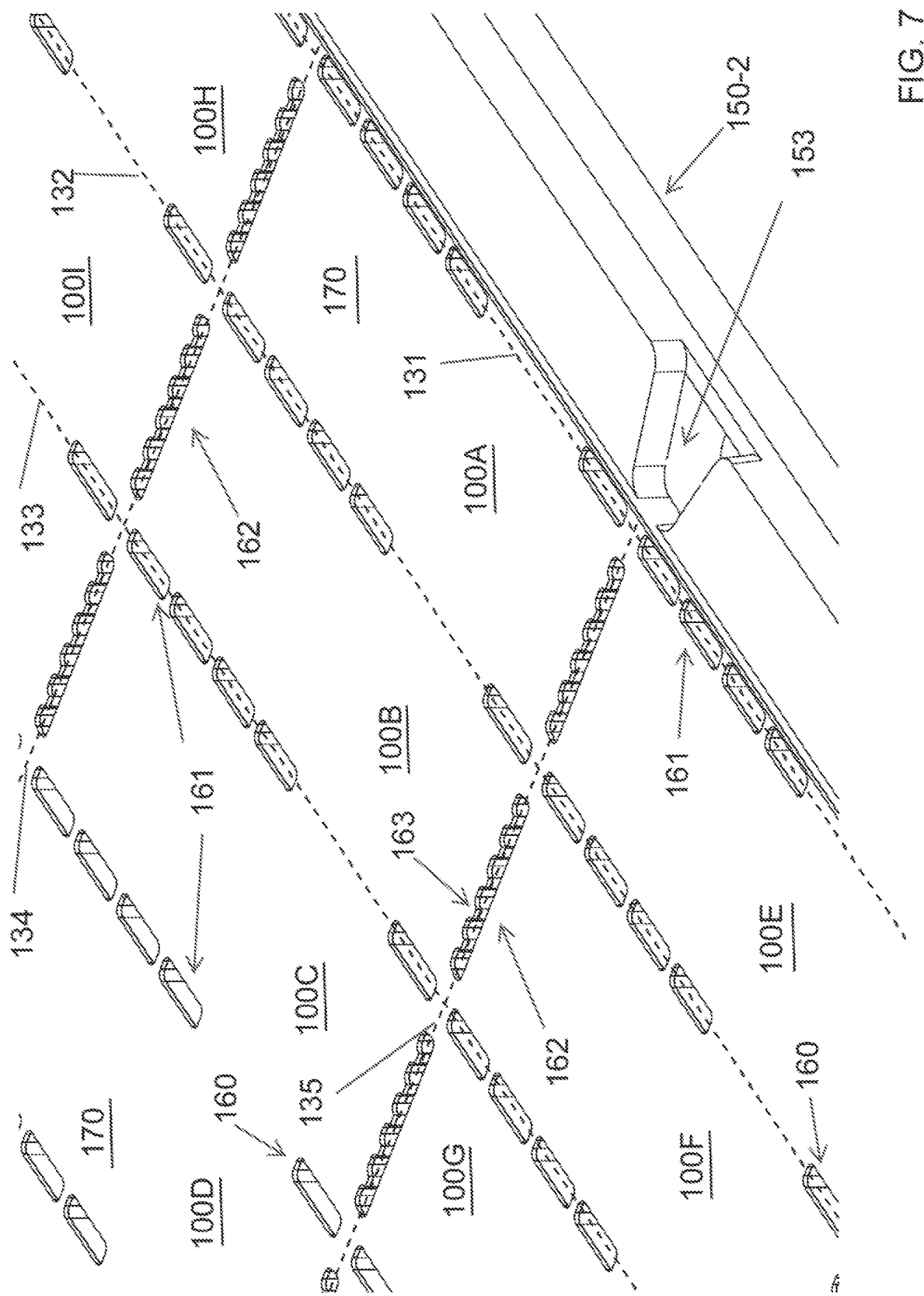
FIG. 7 is an exploded view showing details of the encapsulated panel assembly of FIG. 6 after metallization.

After a first protective copper layer is applied, the rest of the metal layer, e.g. 0.006" of copper (approximately 6 oz equivalent), may be electrolytically plated onto the existing copper layers in an acid solution. Referring to FIG. 7, the metalized panel 150-2 is shown with the top surface 102-1, bottom surface 103-1 (not shown), and interior walls of the slots 160, 161, 162, 163, coated with metal, preferably copper, e.g. metal 170. It will be appreciated that the conductive surfaces of the metalized panel 150-2 need to be patterned to provide the discrete conductive regions required for each module following singulation.

D. Patterning

The metal layer 170 (FIG. 7) may be patterned using traditional photoresist techniques, such as application, exposure using typical ultraviolet exposure tools or preferably using a laser to expose the panel e.g. in a dot matrix exposure pattern, and rinsing away photoresist to create an etch-resistant mask. The masked panel may then be immersed in an etchant to remove the metal, copper and chromium, in the areas in which it is not desired, e.g. to provide spacing between conductors or shields. Afterward, the etch resistant-mask may be stripped from the panel.

In an alternate additive patterning method, photo resist, which is resistant to plating solutions, may be applied over a continuous, or electrically connective, layer of copper. The photo resist may be patterned to expose the areas of copper which are to remain. Then an additional plating step may be used to deposit copper onto the exposed copper, i.e. through the mask openings, after which tin plating or other metals may be used on top of the exposed copper as an etch-resistant mask instead of or in addition to photoresist layer, e.g. to create finer features or spacing. A subsequent etch step removes the unprotected copper and leaves intact the tin plated or otherwise masked copper that was deposited in the intervening plating operation.

Figure 8:
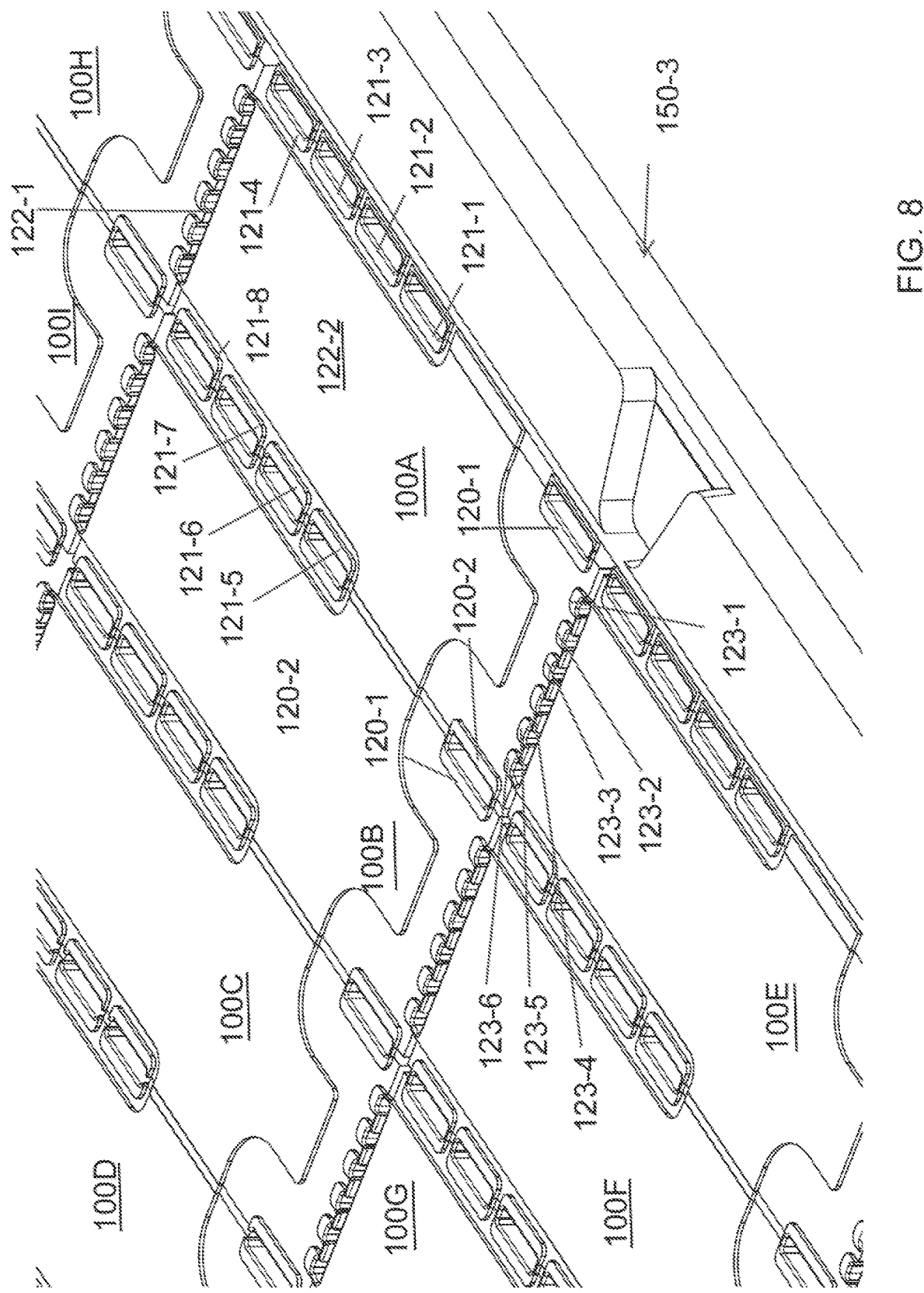
FIG. 8 is an exploded view showing details of the encapsulated panel assembly of FIG. 6 after the metal is patterned.

Referring to FIG. 8, a patterned panel 150-3 is shown with the metal layer 170 etched back to form the desired discrete conductive regions. For example referring to un-singulated module 100A of patterned panel 150-3 in FIG. 8, top shield 122-2 is shown separated from the input contacts 120-1 and 120-2, output contacts 121-1, 121-2, 121-3, 121-4, 121-5, 121-6, 121-7, and 121-8, and control contacts 123-1, 123-2, 123-3, 123-4, 123-5, and 123-6 but connected to common contact 122-1. Note that spacing (setback) from the top shield 122-2 and the input 120-1, 120-2 and control 123 contacts is greater than to the output contacts 121.

E. Finish Plating

A finish such as gold may be plated onto the copper areas as is customary in the electronics industry. For example an electroless nickel-immersion gold ("ENIG") plating process may be used to plate nickel, e.g. 200μ" thick, and then gold, e.g. 1μ" thick over the remaining metal.

After the finish plating, the panel may be labeled, e.g. using a laser, to mark each module with safety agency, manufacturer, serial number, lot number, and any desired information prior to singulation.

F. Singulation

Figure 9:
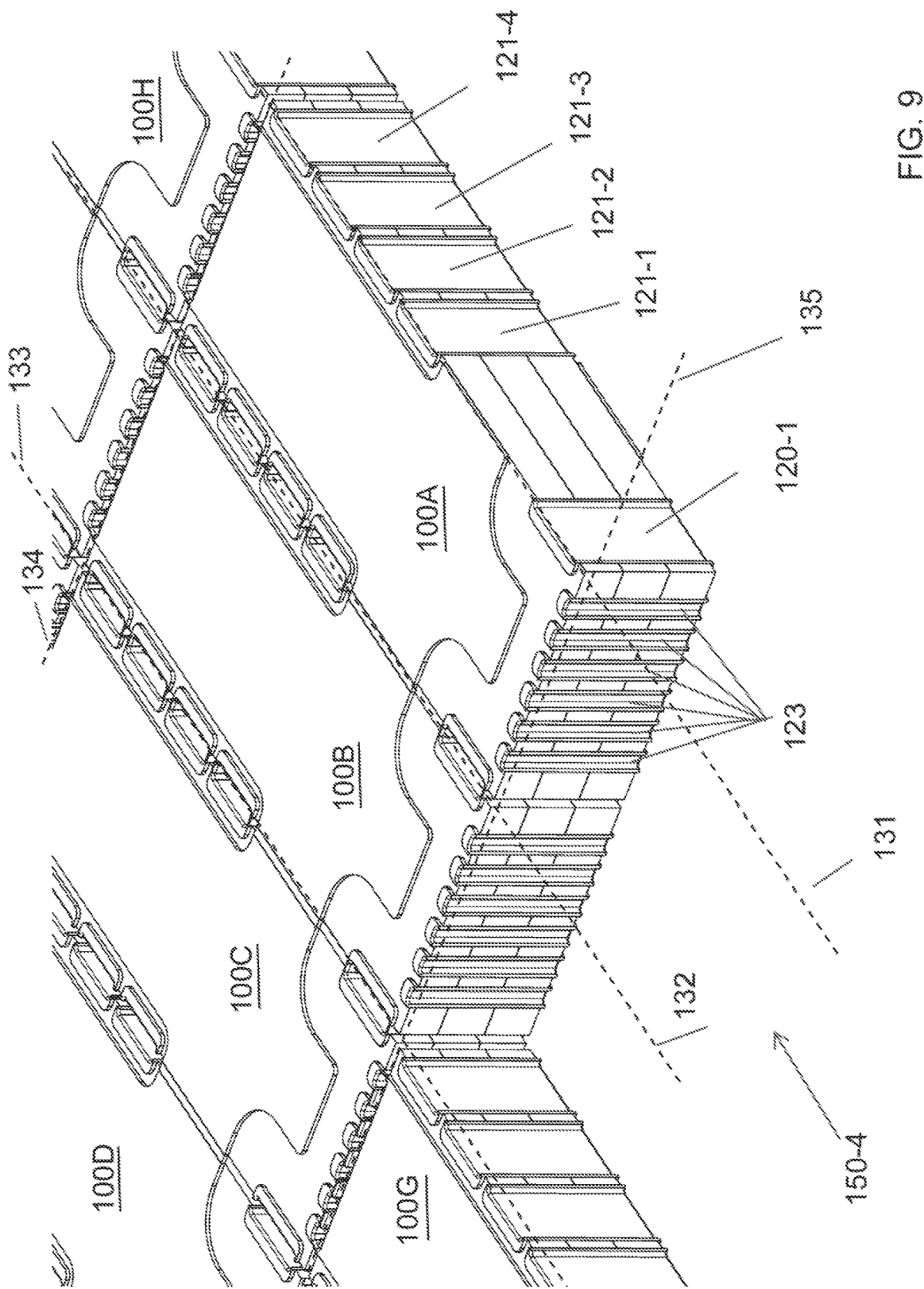
FIG. 9 is an exploded view showing details of the encapsulated panel assembly of FIG. 8 after singulation.

After the panel is metalized in the above described manner, it may be cut along the cut lines to separate individual modules from the panel. It will be appreciated that the grooves or castellations in the sidewalls of the singulated modules, e.g. 100A, 100B (FIG. 9) are formed by cutting, e.g. during singulation, through the slots or holes, e.g. slots 160, 161, 162, 163, in the encapsulated panel. For example, FIG. 9 shows a singulated panel 150-4 having been cut along cut lines 131, 132, 133, 134, 135 with modules 100E and 100F removed but other modules left in place to show the resulting castellated signal contacts 123 on modules 100A and 100B and input 120-1 and output 121-1, 121-2, 121-3 and 121-4 contacts on module 100A. Each of the signal contacts 123, input contact 120-1, and output contacts 121-1, 121-2, 121-3, and 121-4 may extend from a top surface of the top encapsulant to a bottom surface of the bottom encapsulant as shown. Alternatively, the contacts may extend from the PCB toward one or both of the top surface of the top encapsulant and the bottom surface of the bottom encapsulant. Preferably a thin saw, e.g. 0.012" blade, may be used for singulation to avoid requiring unnecessarily large slots and holes and to maintain panel utilization. It will be appreciated that the width of the slots in the area of the desired contacts should be greater than the width of the saw cuts along the cut lines, which should be narrower than the metalized slots in the area of the desired contacts to avoid removing the metal contacts during singulation. Conversely, the width of the slots, to the extent there is a cut, between individual contacts should be narrower than the saw cut to ensure the metal between individual contacts is completely removed to electrically isolate each contact. Referring for example to the slots along cut line 135, contours 162 and the indentations of contour 163 are set back from the cut line 135 sufficiently to provide slot widths that prevent the saw from removing the metal along the intended contact walls. The saw tooth features of contours 163 that extend toward the cut line are close enough to the cut line to ensure that the saw removes metal between the individual contacts 123 (FIG. 9), i.e. removes the metal on the tips of the saw teeth and optionally a portion of the teeth themselves. Small vertical strips of copper, e.g. 0.006" thick, will be left exposed along the vertical edges of the plated castellations as the saw cuts through the thickness of the plating on the walls of the slots and holes at the edges of each metal contact. However, the thin strips, accounting for less than 10% of the contact area, which is within industry standards, should not be problematic.

III. Modifications and Alternatives

Many modifications of the above described process are possible. For example, a grid pattern may optionally be etched, e.g. by laser, into the panel surface before the optional ultrasonic cleaning and subsequent seed layer steps to improve adhesion of the metal layers to the panel surfaces.

A. Conductive Epoxy Seed Alternative

In a first alternative example, step (b) above may be modified by applying a layer of conductive epoxy, e.g. a 0.0002-0.0006 inch thick layer of silver epoxy, instead of sputtering. In such an example, the process flow may include: (a) cutting the slots and holes; (b) applying a patterned layer of silver epoxy on the major surfaces of the panel (adjacent to but not in the slots or holes); (c) coat the panel with graphite or carbon, either the entire surface or selectively in the holes and groves; (d) electrolytic copper plating, e.g. 0.001-0.003 inches; (e) apply a patterned plating-resistant mask; (f) plate copper preferably 0.003 or thicker and then tin in unmasked areas; (g) remove mask; (h) etch exposed copper (copper without tin covering) (i) remove tin; (j) plate nickel, e.g. 200μ", and gold, e.g. 1μ"; and (k) singulate. Additional optional steps include ultrasonic cleaning before application of the conductive epoxy, and optionally plating copper, e.g. electrolessly, onto the epoxy layer before applying graphite.

B. Direct Metallization Alternative

In a second alternative example, the panel may be directly metallized instead of sputtering or applying conductive epoxy as seed layers. Such a process may include the following steps (after the encapsulated panel is lapped and cleaned): (a) polymer coat/treat the panel; (b) direct metallization of 0.5 mils copper layer; (c) cut the slots and holes; (d) apply shadow graphite; (e) copper plate to a desired thickness, e.g. 6 mils; (f) pattern the copper, e.g. using the photolithographic etch processes described above; (g) finish plate the remaining copper, e.g. ENIG and laser mark the panel; (h) cut the panel along the cut lines to singulate the modules.

A typical polymer coating process may include a plasma cleaning activation of the encapsulated panel; application of an adhesion promoter; application of a polymer layer, e.g. having a thickness of 1,000 angstroms to a few microns; thermal treatment of the polymer and adhesion promoter; activation of the polymer for electroless metal deposition, e.g., by application of a catalyst or oxidation of the polymer; and electroless metal deposition.

C. Improved Bar Code Connections

In a third alternative example in which the top and bottom surfaces of the panel need not be plated, the process described above may be used to form contacts over the bar codes only. Alternatively, the holes may be cut by drill or laser; the walls of the hole may be de-smeared; sensitize the walls of the hole, e.g. using chemicals, to attract a catalyst; activate the walls of the holes with a catalyst such as a Palladium based chemical; electrolessly plate copper or nickel metal; finish the plated metal, e.g. using ENIG plating.

Alternatively, the exposed interconnects of singulated modules [e.g., singulated module 815 (FIG. 10)] may be plated, e.g. by placing the singulated modules in plating bath resistant trays or fixtures, in a typical ENIG or similar electroless baths to form an ENIG surface over the exposed interconnects (bar codes). The plating, which may bridge adjacent layers of the buried interconnects to form a continuous metal layer over each bar code or may simply plate the individual bar code elements without bridging. The ENIG plating may provide a non-copper surface for soldering, e.g. to adapter leads 808, 809 (FIG. 10).

D. Thermal Conduits

Figure 11:
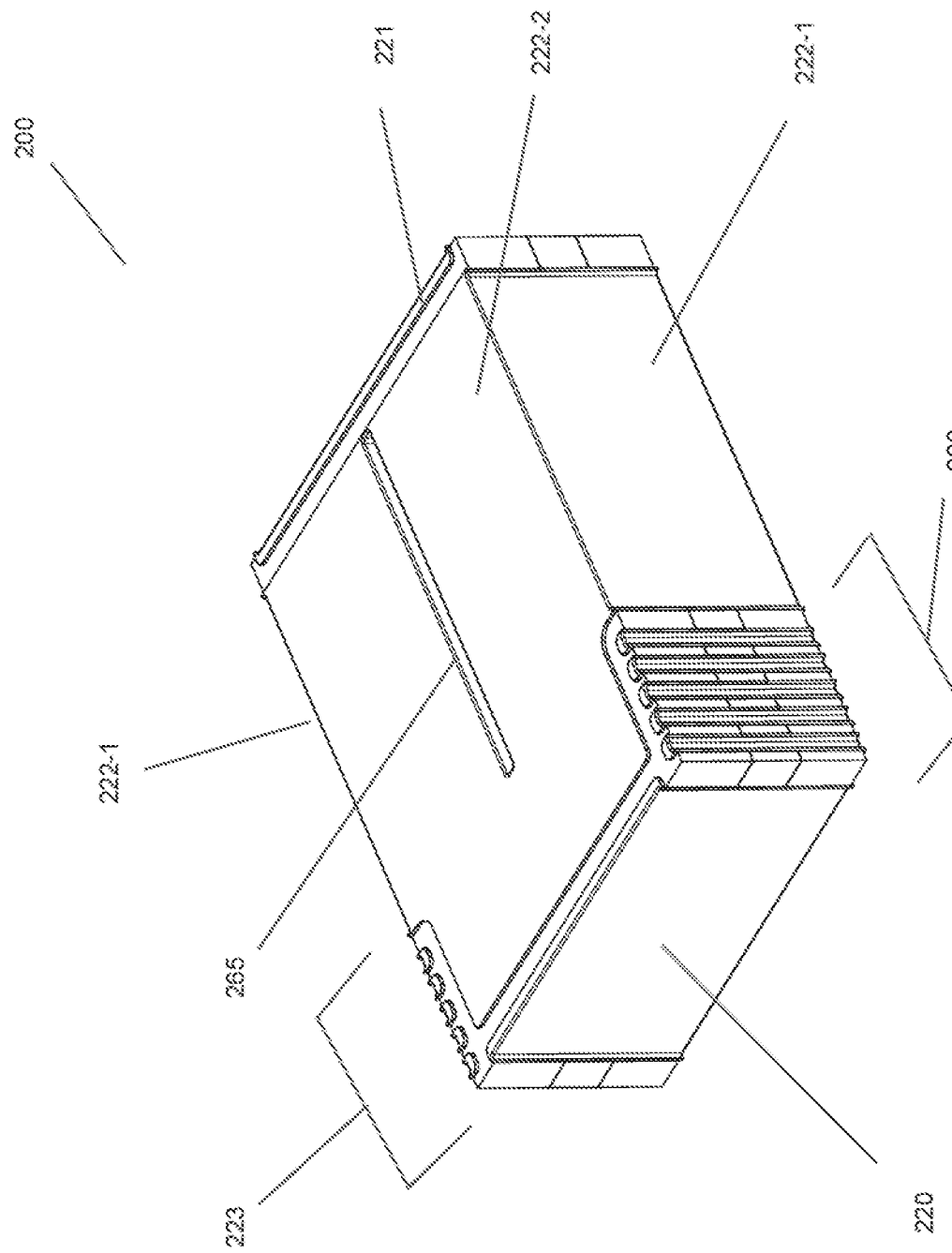
FIG. 11 shows an isometric view of a leadless panel-molded power converter module having castellated electrical-connections, integral heat-spreading EMI-shields, and a thermal conduit for conducting heat away from a central portion of the converter.

The leadless panel mold process described above in connection with FIGS. 5-9 may be readily adapted to form thermal conduits in the singulated modules. A singulated leadless panel-molded power-converter module 200 is shown in FIG. 11 having an input power contact 220, an output power contact 221, two common contacts 222-1, a conductive shield 222-2 on the top of the module which may as shown be electrically and connected to the common contacts 222-1, and a plurality of control signal contacts 223. In addition, the module 200 is shown having a thermal conduit 265 for conducting heat away from a central portion of the module to the top shield 222-2. The three-terminal power converter module 200 of FIG. 11 may be fabricated using the same leadless panel mold processes described above in connection with FIGS. 5-9. For example, a slot (or one or more auxiliary holes) may be cut, e.g. by laser, water jet, or machining such as milling or drilling, in the desired location and having the desired dimensions during the slot cutting process and then metallized as described above to form the thermal conduit 265. The thermal conduit slot may extend entirely through the panel to provide a thermal conduit that extends between the top and bottom surfaces. The thermal conduit slot may exposes conductive features to provide thermal, and optionally electrical, connections between the substrate and the top and/or bottom conductive layers. The thermal conduit slot may alternatively be formed to controlled depths to provide thermal pathways to selected components. For example, the slot may be cut partially through the encapsulant above selected components, maintaining the electrical insulation provided by the encapsulant between the selected components and the thermal conduit 265. In one example a 6 mil wide slot may be cut to a controlled depth above selected electronic switches, such as MOSFETS, in the module and then metallized along with the remainder of the panel. If cut by laser such as a typical carbon dioxide laser, a metal shield, e.g. copper, may be provided on or above the surface of the component to limit the depth of the cut. The metallization may partially or completely fill the thermal conduit slot, e.g. with copper, depending upon the thickness of the deposited metal layer. In either approach the metal provides thermal and optionally electrical pathways from selected interior portions of the module 200 to the top or bottom, or both top and bottom surfaces. Although a straight long thermal conduit 265 is shown in FIG. 11, it will be appreciated that any desired shape or size thermal conduit may be provided using the above process.

E. Carrier Surface Connections

Figure 12:
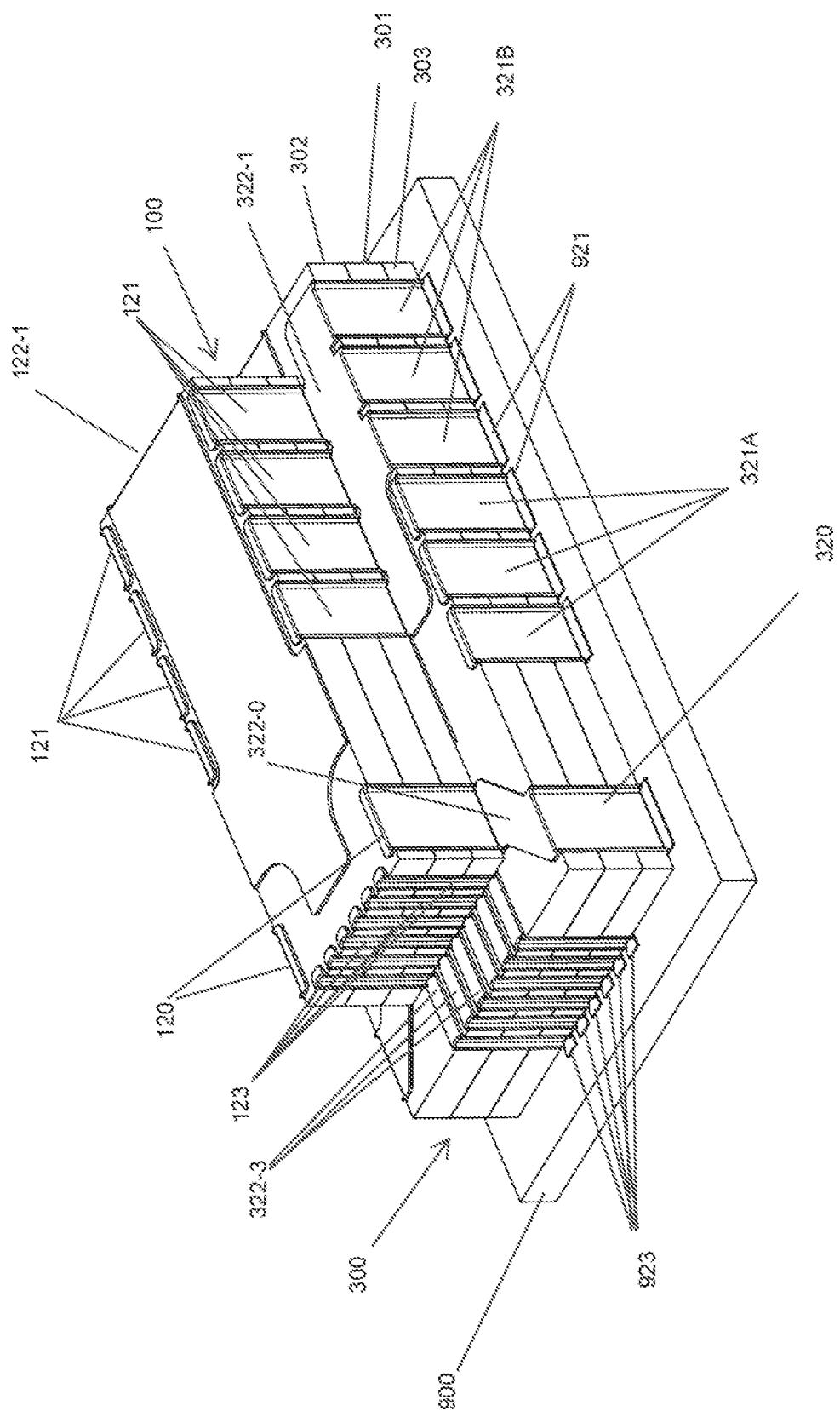
FIG. 12 shows an isometric view of a stacked module assembly including a leadless panel-molded electronic module mounted on top of a second leadless panel-molded electronic module which is mounted onto a printed circuit board.

Although the leadless module 100 has been described having surface metal (e.g. top and bottom shields 122-2 and 122-3) well adapted for improving electromagnetic shielding and thermal performance, it should be appreciated by those of skill in the art that many variations are possible. For example, the metal on one or more surfaces, e.g. preferably the top surface, may be patterned in a manner that would allow one or more components to be mounted onto and electrically connected to the module or to external circuitry via the module. Referring to FIG. 12 (and the exploded view of FIG. 13), a stacked module arrangement is shown having the leadless electronic module 100 shown in FIGS. 1-3 mounted onto and electrically connected, e.g. by solder, onto another leadless carrier module 300, which is in turn mounted onto and electrically connected, e.g. by solder, to a printed circuit board 900.

Figure 13:
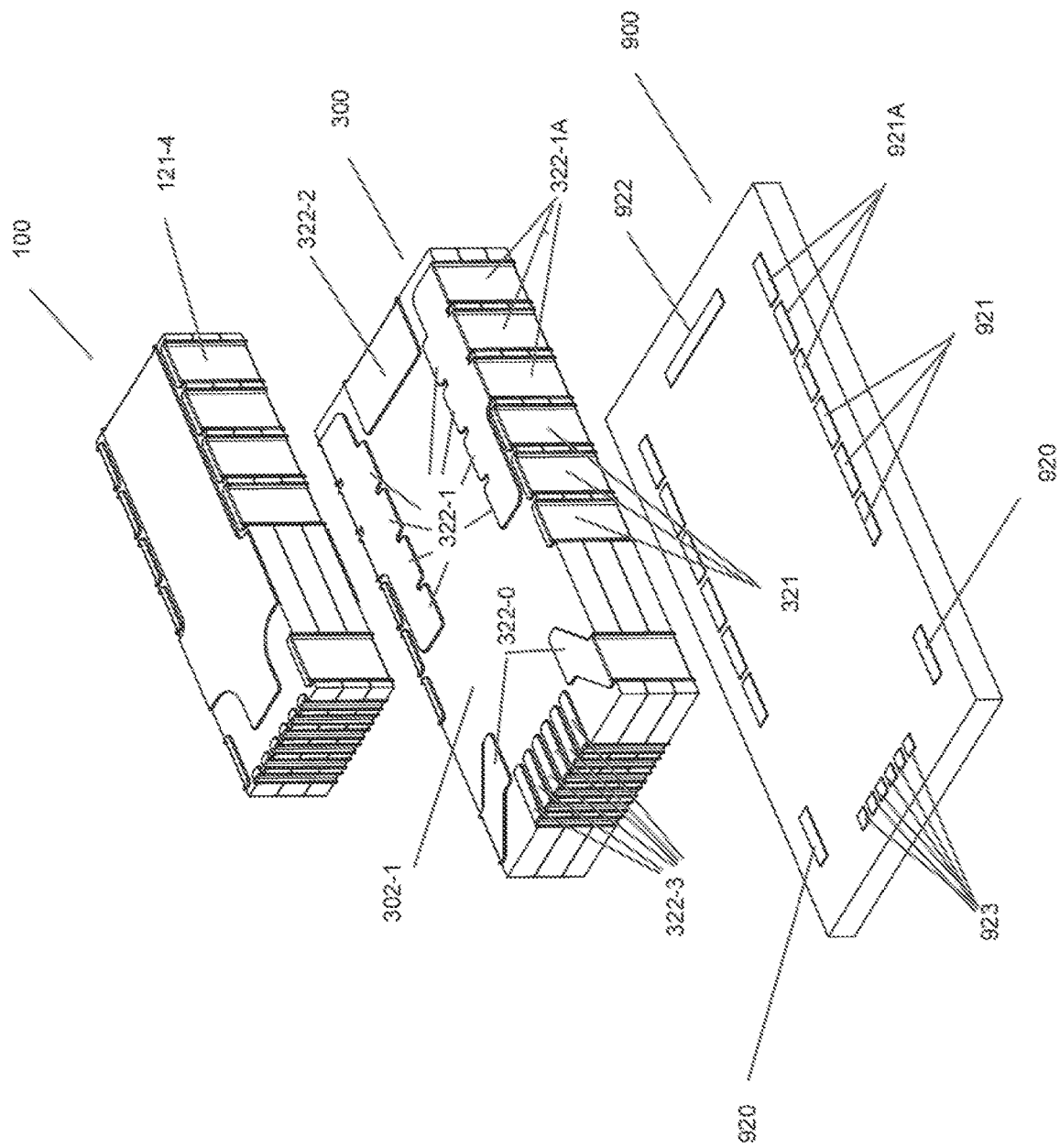
FIG. 13 is an exploded view of the stacked module assembly of FIG. 12.

In some implementations, the carrier module 300 includes a circuit board 301 disposed between cured encapsulants 302 and 303. The metallization layer 322 on the top surface 302-1 of carrier module 300 may be patterned to provide pads aligned with respective electrical contacts on the leadless electronic module 100. For example, pads 322-0, 322-1, 322-2, 322-3 as shown (FIG. 13) on the top surface 302-1 of module 300 align with electrical contacts 120, 121, 122-1, and 123 on module 100 when stacked on top of (FIG. 12) of module 300. The electrical contacts may be soldered to the pads to provide both thermal and electrical connections. Although all of the electrical contacts along the sides of module 100 are shown in FIGS. 12 and 13 as having respective pads on the top surface of module 300, it should be appreciated, that a one to one correlation of pads to contacts need not be established, e.g. some contacts may have no corresponding pad or some pads may have no corresponding contact.

As shown, the pads 322 may be connected to, or form part of, conductive runs that connect to respective contacts along the side of module 300 which may in turn be electrically connected to lands on the printed circuit board 900. For example, pads 322-1 are shown connected to side contacts 322-1A which in turn may be connected to respective lands 921A on PCB 900. Similarly, pads 322-0, 322-2 and 322-3 are configured to connect to respective lands 920, 922, and 923 on PCB 900. The side contacts of module 300 may, or may not, be electrically connected to circuitry within module 300 and not all side contacts need to connect to a respective pads on top of module 300, e.g., side contacts 321 are shown connecting to lands 921 on PCB 900 but not to any pads on top of module 300. Although the details of the conductive runs of PCB 900 are not shown for simplicity, it is understood that each land provided on PCB 900 for module 300 may be connected to external circuitry via conductive runs in PCB 900, may be connected to other selected lands on PCB 900 providing a bridge between side contacts, or remain isolated from other lands and circuitry providing mechanical support without further electrical connection within the system. Thus, each electrical contact on the side of module 300 may be used to connect to module 100, to PCB 900, to both module 100 and PCB 900, or neither, flexibly allowing each contact in module 100 to be connected directly to PCB 900 without any connection to circuitry in module 300, or to be connected to circuitry in module 100, either with a connection to PCB 900 or without.

A number of embodiments of the invention have been described. Nevertheless, it will be understood that various modifications may be made without departing from the spirit and scope of the invention. For example, the grooves may be completely filled during the metallization process to form smooth sidewalls on the module after singulation by electrolessly plating leads to the holes (using above process), then plating up electrolytically to fill the hole, and cutting through the filled hole to leave a smooth sidewall. Although the stacked arrangement is shown with the lower module 300 having a larger footprint, i.e. larger in length and width, than the upper module 100, it should be appreciated that the stacked modules may have similarly or identically sized footprints. The thermal conduits may alternatively form electrical connections to pads on the surface of the module. In FIGS. 12 and 13, the pad 322-1 is shown electrically connecting the four output contacts 121-1, 121-2, 121-3, and 121-4 of module 100 to the three contacts 321B of module 300, but other arrangements are also possible. For example, in some implementations, the pad 322-1 can be configured such that each of the contacts 321B can be connected to one or more of the output contacts 121-1, 121-2, 121-3, and 121-4. The terms "top" and "bottom" are used to describe relative positions of items shown in the drawings. It is understood that the modules and devices described in this document can be placed in various orientations such that, e.g., a "top surface" may be facing downwards or sideways, and a "bottom surface" may be facing upwards or sideways.

Accordingly, other embodiments are within the scope of the following claims.

What is claimed is:

1. A method of forming modular circuit assemblies, the method comprising:
    assembling an encapsulated panel including a multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each unsingulated electronic module having respective perimeter boundaries defined by and extending along one or more predetermined cut lines, along which the panel is cut in a subsequent step to singulate the electronic modules, and one or more conductive features buried beneath the first exterior surface within its respective perimeter boundaries;
    selectively forming a plurality of holes in the first exterior surface of the panel through the first layer of cured encapsulant at predetermined locations within the respective perimeter boundaries of each electronic module, each hole being spaced apart from the perimeter boundaries and exposing within the hole a respective conductive feature;
    selectively forming one or more conductive metal layers on the first exterior surface of the first layer of cured encapsulant of the panel including at predetermined locations and within the plurality of holes within the respective perimeter boundaries of each electronic module, the one or more conductive metal layers within each hole being in electrical contact with the respective conductive feature; and
    patterning the one or more conductive metal layers on the exterior surface, to form a plurality of electrical contacts on the exterior surface of the panel electrically isolated from at least one other electrical contact in the plurality of electrical contacts within the respective perimeter boundaries of each electronic module.

2. A method of making circuit assemblies, the method comprising:
    assembling an encapsulated panel including a substrate having electronic components mounted to the substrate and a plurality of conductive features enclosed within the panel and unexposed to an exterior surface of the panel, the panel comprising one or more electronic modules having respective pre-defined boundaries;
    selectively forming a plurality of holes in the exterior surface of the panel at locations within the respective pre-defined boundaries of each electronic module, each hole being formed at a respective predetermined location spaced apart from the respective pre-defined boundaries and exposing within the hole a respective conductive feature, wherein the electronic modules is singulated along the pre-defined boundaries in a subsequent step;
    selectively forming one or more conductive metal layers on the exterior surface of the panel including at predetermined locations and within the plurality of holes within the respective perimeter boundaries of each electronic module, the one or more conductive metal layers within each hole being in electrical contact with the respective conductive feature exposed within the hole, to form electrical contacts on the exterior surface of the panel; and
    patterning the one or more conductive metal layers on the exterior surface to electrically isolate at least one electrical contact from one or more other electrical contacts within the respective perimeter boundaries of each electronic module.

3. The method of claim 1 wherein the selectively forming holes further comprises controlling a depth of each hole without exposing within the hole any components in the one or more electronic modules.

4. The method of claim 3 wherein the selectively forming holes further comprises cutting through a first layer of encapsulant extending from the external surface to a surface of the substrate and wherein the conductive feature comprises a conductive trace on the surface of the substrate.

5. The method of claim 4 wherein the selectively forming a plurality of holes further comprises using a laser; the respective conductive feature comprises a conductive trace on the first surface of the PCB; wherein the laser comprises a wavelength that removes encapsulant at a rate that is greater than a rate at which material would be removed from the conductive trace; and wherein the plurality of holes are formed at a depth that is limited by the respective conductive trace on the surface of the PCB.

6. The method of claim 4 wherein the selectively forming one or more conductive metal layers further comprises partially or completely filling the holes.

7. The method of claim 5 further comprising cutting the panel along the one or more cut lines to singulate the plurality of electronic modules, each singulated electronic module having at least one of the electrical contacts formed on the exterior surface of the module.

8. The method of claim 1 further comprising cutting the panel along the one or more cut lines to singulate the plurality of electronic modules, each singulated electronic module having a plurality of the electrical contacts formed on the exterior surface of the module.

9. The method of claim 8 wherein the patterning the one or more conductive metal layers on the exterior surface further comprises forming one or more conductive metal pads electrically connected to a respective exposed conductive feature.

10. The method of claim 2 wherein the patterning the one or more conductive metal layers on the exterior surface further comprises forming one or more conductive metal pads electrically connected to a respective exposed conductive feature.

11. The method of claim 2 wherein the selectively forming holes further comprises controlling a depth of each hole without exposing within the hole any electronic components in the one or more electronic modules.

12. The method of claim 2 wherein the selectively forming holes further comprises cutting through a first layer of encapsulant extending from the external surface to a surface of the substrate and wherein the conductive feature comprises a conductive trace on the surface of the substrate.

13. The method of claim 2 wherein the selectively forming a plurality of holes further comprises using a laser; the respective conductive feature comprises a conductive trace on the first surface of the PCB; wherein the laser has a wavelength that removes encapsulant at a rate that is greater than a rate at which material would be removed from the conductive trace; and
wherein the plurality of holes are formed at a depth that is limited by the respective conductive trace on the surface of the PCB.

14. The method of claim 2 wherein the selectively forming one or more conductive metal layers further comprises partially or completely filling the holes.

15. The method of claim 2 further comprising cutting the panel along the one or more pre-defined boundaries to singulate the one or more electronic modules, leaving each electronic module with at least one electrical contact formed on the exterior surface of the module.

16. The method of claim 12 wherein each electronic module has a plurality of the electrical contacts formed on the exterior surface of the module.

17. The method of claim 1 wherein selectively forming a plurality of holes comprises selectively forming one or more slots.

18. The method of claim 3 wherein selectively forming holes comprises forming a hole extending to a controlled depth above an electronic switch, and providing a thermal pathway to the electronic switch using the hole.

19. The method of claim 1 wherein selectively forming a plurality of holes comprises selectively forming a plurality of thermal conduits.

20. The method of claim 19 wherein selectively forming a plurality of thermal conduits comprises selectively forming one or more thermal conduits that extend through the panel to provide one or more thermal conduits that extend between top and bottom surfaces of the panel.

21. The method of claim 2 wherein selectively forming a plurality of holes comprises selectively forming one or more slots.

22. The method of claim 11 wherein selectively forming the holes comprises forming a hole extending to a controlled depth above an electronic switch, and providing a thermal pathway to the electronic switch using the hole.

23. The method of claim 11, comprising providing a metal shield above one or more components in the one or more electronic modules,
wherein selectively forming the holes comprises using a laser to cut one or more holes above the one or more electronic modules, and using the metal shield to limit the depth of the one or more holes cut by the laser.

24. The method of claim 2 wherein selectively forming a plurality of holes in the exterior surface of the panel comprises forming a first hole that extends from a first selected interior portion of the panel to a top surface of the panel, and forming a second hole that extends from the first selected interior portion or a second selected interior portion of the panel to a bottom surface of the panel.

25. The method of claim 2 wherein selectively forming a plurality of holes comprises selectively forming a plurality of thermal conduits.

26. The method of claim 25 wherein selectively forming a plurality of thermal conduits comprises selectively forming one or more thermal conduits that extend through the panel to provide one or more thermal conduits that extend between top and bottom surfaces of the panel.

27. A method of forming modular circuit assemblies, the method comprising:
assembling an encapsulated panel including a multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each module having perimeter boundaries defined by one or more predetermined cut lines and one or more conductive features buried beneath the first exterior surface;
selectively forming a plurality of holes in the first exterior surface of the panel through the first layer at predetermined locations within the perimeter boundaries of each electronic module, each hole being spaced apart from the cut lines and exposing within the hole a respective conductive feature;
selectively forming one or more conductive metal layers on the first exterior surface of the panel including within the plurality of holes, the one or more conductive metal layers within each hole being in electrical contact with the respective conductive feature;
patterning the one or more conductive metal layers on the exterior surface, to form a plurality of electrical contacts on the exterior surface of the panel electrically isolated from at least one other electrical contact in the plurality of electrical contacts; and
providing a metal shield above one or more components in the one or more electronic modules;
wherein the selectively forming holes comprises using a laser to cut one or more holes above the one or more electronic modules, and using the metal shield to limit a depth of the one or more holes cut by the laser.

28. A method of forming modular circuit assemblies, the method comprising:
assembling an encapsulated panel including a multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel comprising a plurality of unsingulated electronic modules, each module having perimeter boundaries defined by one or more predetermined cut lines and one or more conductive features buried beneath the first exterior surface;
selectively forming a plurality of holes in the first exterior surface of the panel through the first layer at predetermined locations within the perimeter boundaries of each electronic module, each hole being spaced apart from the cut lines and exposing within the hole a respective conductive feature;

selectively forming one or more conductive metal layers on the first exterior surface of the panel including within the plurality of holes, the one or more conductive metal layers within each hole being in electrical contact with the respective conductive feature; and patterning the one or more conductive metal layers on the exterior surface, to form a plurality of electrical contacts on the exterior surface of the panel electrically isolated from at least one other electrical contact in the plurality of electrical contacts;

wherein selectively forming a plurality of holes in the exterior surface of the panel comprises forming a first hole that extends from a first selected interior portion of the panel to a top surface of the panel, and forming a second hole that extends from the first selected interior portion or a second selected interior portion of the panel to a bottom surface of the panel.

29. A method of making circuit assemblies, the method comprising:

assembling an encapsulated panel including a substrate having electronic components mounted to the substrate and a plurality of conductive features enclosed within the panel and unexposed to an exterior surface of the panel, the panel comprising one or more electronic modules having pre-defined boundaries;

selectively forming a plurality of holes in the exterior surface of the panel, each hole being formed at a respective predetermined location spaced apart from the pre-defined boundaries and exposing within the hole a respective conductive feature;

selectively forming one or more conductive metal layers on the exterior surface of the panel including within the plurality of holes, the one or more conductive metal layers within each hole being in electrical contact with the respective conductive feature exposed within the hole, to form electrical contacts on the exterior surface of the panel;

patterning the one or more conductive metal layers on the exterior surface to electrically isolate at least one electrical contact from one or more other electrical contacts; and providing a metal shield above one or more components in the one or more electronic modules;

wherein the selectively forming the holes comprises using a laser to cut one or more holes above the one or more electronic modules, and using the metal shield to limit a depth of the one or more holes cut by the laser.

30. A method of making circuit assemblies, the method comprising:

assembling an encapsulated panel including a substrate having electronic components mounted to the substrate and a plurality of conductive features enclosed within the panel and unexposed to an exterior surface of the panel, the panel comprising one or more electronic modules having pre-defined boundaries;

selectively forming a plurality of holes in the exterior surface of the panel, each hole being formed at a respective predetermined location spaced apart from the pre-defined boundaries and exposing within the hole a respective conductive feature;

selectively forming one or more conductive metal layers on the exterior surface of the panel including within the plurality of holes, the one or more conductive metal layers within each hole being in electrical contact with the respective conductive feature exposed within the hole, to form electrical contacts on the exterior surface of the panel; and patterning the one or more conductive metal layers on the exterior surface to electrically isolate at least one electrical contact from one or more other electrical contacts;

wherein selectively forming a plurality of holes in the exterior surface of the panel comprises forming a first hole that extends from a first selected interior portion of the panel to a top surface of the panel, and forming a second hole that extends from the first selected interior portion or a second selected interior portion of the panel to a bottom surface of the panel.

31. The method of claim 27 wherein the selectively forming holes comprises controlling the depth of each hole without exposing within the hole any components in the one or more electronic modules.

32. The method of claim 29 wherein the selectively forming holes further comprises controlling the depth of each hole without exposing within the hole any electronic components in the one or more electronic modules.

* * * * *